United States Patent
Schweitzer, III et al.

(10) Patent No.: US 11,105,832 B2
(45) Date of Patent: Aug. 31, 2021

(54) HIGH-FIDELITY VOLTAGE MEASUREMENT USING A CAPACITANCE-COUPLED VOLTAGE TRANSFORMER

(71) Applicant: Schweitzer Engineering Laboratories, Inc., Pullman, WA (US)

(72) Inventors: Edmund O. Schweitzer, III, Pullman, WA (US); Bogdan Z. Kasztenny, Markham (CA); Veselin Skendzic, Schwenksville, PA (US); Travis C. Mallett, Pullman, WA (US); Robert Lopez, Jr., Palouse, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/063,823

(22) Filed: Oct. 6, 2020

(65) Prior Publication Data

US 2021/0018538 A1    Jan. 21, 2021

Related U.S. Application Data

(63) Continuation-in-part of application No. 16/137,186, filed on Sep. 20, 2018, now Pat. No. 10,802,054.

(60) Provisional application No. 62/562,267, filed on Sep. 22, 2017.

(51) Int. Cl.
| | |
|---|---|
| *G01R 15/16* | (2006.01) |
| *G01R 15/06* | (2006.01) |
| *H02H 7/26* | (2006.01) |
| *H01F 27/42* | (2006.01) |
| *G01R 31/11* | (2006.01) |

(52) U.S. Cl.
CPC ............ *G01R 15/16* (2013.01); *G01R 15/06* (2013.01); *G01R 31/11* (2013.01); *H01F 27/427* (2013.01); *H02H 7/265* (2013.01)

(58) Field of Classification Search
CPC ........ G01R 15/16; G01R 15/06; G01R 31/11; H02H 7/265; H01F 38/28
See application file for complete search history.

(56) References Cited

U.S. PATENT DOCUMENTS

| | | | |
|---|---|---|---|
| 9,008,982 B2 * | 4/2015 | Tziouvaras | G01R 31/62 |
| | | | 702/65 |
| 9,411,003 B2 * | 8/2016 | Danesh | G01R 35/005 |
| 2003/0164714 A1 * | 9/2003 | Ghassemi | G01R 15/06 |
| | | | 324/658 |
| 2006/0170432 A1 * | 8/2006 | Adolfsson | G01R 15/16 |
| | | | 324/658 |

(Continued)

*Primary Examiner* — Dominic E Hawkins
(74) *Attorney, Agent, or Firm* — Richard M. Edge; Jared L. Cherry

(57) ABSTRACT

The present disclosure pertains to systems and methods for detecting traveling waves in electric power delivery systems. In one embodiment, a system comprises a capacitance-coupled voltage transformer (CCVT) in electrical communication with the electric power delivery system, the CCVT comprising a stack of capacitors and an electrical contact to a first ground connection. Electrical signals from accessible portions of the CCVT are used to detect traveling waves. Current and/or voltage signals may be used. In various embodiments, a single current may be used. The traveling waves may be used to detect a fault on the electric power delivery system.

17 Claims, 19 Drawing Sheets

(56) References Cited

U.S. PATENT DOCUMENTS

| | | | |
|---|---|---|---|
| 2008/0077336 A1* | 3/2008 | Fernandes | G01R 15/142 |
| | | | 702/57 |
| 2013/0238267 A1* | 9/2013 | Tziouvaras | G01R 33/12 |
| | | | 702/65 |
| 2013/0250458 A1* | 9/2013 | Finney | H02H 3/05 |
| | | | 361/42 |
| 2016/0077149 A1* | 3/2016 | Schweitzer, III | G01R 31/08 |
| | | | 307/131 |
| 2016/0216310 A1* | 7/2016 | Schweitzer, III | G01R 31/11 |

* cited by examiner

HIGH-FIDELITY VOLTAGE MEASUREMENT USING A CAPACITANCE-COUPLED VOLTAGE TRANSFORMER

RELATED APPLICATION

The present application claims benefit as a Continuation-in-Part of U.S. Non-Provisional application Ser. No. 16/137,186 filed on 20 Sep. 2018, titled "HIGH-FIDELITY VOLTAGE MEASUREMENT USING A CAPACITANCE-COUPLED VOLTAGE TRANSFORMER" which claims priority under 35 U.S.C. § 119 to U.S. Provisional Patent Application No. 62/562,267, titled HIGH-FIDELITY VOLTAGE MEASUREMENT USING CURRENT TRANSFORMERS IN A CAPACITANCE COUPLED VOLTAGE TRANSFORMER filed Sep. 22, 2017, each of which are incorporated by reference.

TECHNICAL FIELD

This disclosure relates to obtaining high-fidelity voltage measurements in an electric power delivery system using one or two current transformers on a capacitance-coupled voltage transformer (CCVT).

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
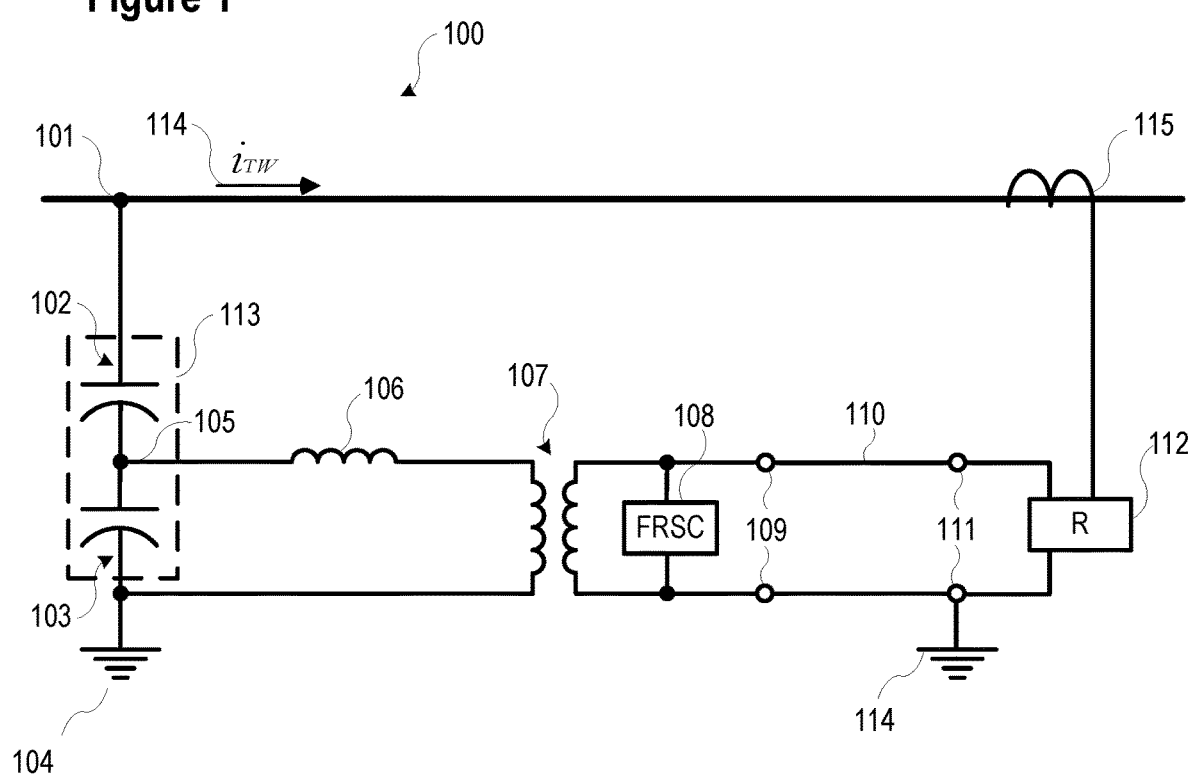
FIG. 1 illustrates a simplified diagram of a system including a CCVT consistent with the present disclosure.

Traveling waves are surges of electricity resulting from sudden changes in voltage, such as short circuits, that propagate along power lines at very high velocities. The propagation velocity is close to the speed of light in free space for overhead lines and about half the speed of light in free space for underground cable lines. Traveling waves originating at the location of a short circuit on a transmission line arrive at the line terminals in as little as 1-2 milliseconds following the fault, depending on the fault location and line type. Relative timing, polarity and magnitudes of traveling waves allow precise fault locating and enable several line protection techniques. Because traveling waves are available at the line terminal very quickly following a line short circuit, they allow ultra-high-speed protection and associated benefits.

A traveling wave has current and voltage components. As the traveling wave propagates, at any point along the line a sudden change in voltage can be observed ("a voltage traveling wave") as well as a sudden change in current ("a current traveling wave"). The voltage and current traveling waves on the line, away from the line ends, are related by the line characteristic impedance, as expressed in Eq. 1.

$$\text{Voltage Traveling Wave} = \text{Current Traveling Wave} * \text{Characteristic Impedance} \quad \text{Eq. 1}$$

When a traveling wave arrives at a discontinuity in the characteristic impedance, such as a busbar connecting multiple lines and other power system elements, part of the wave reflects back in the direction of arrival, and part of the wave continues in the original direction. These waves are separately referred to as an incident wave (the wave that arrived at the discontinuity), a reflected wave (the wave that reflected back), and a transmitted wave (the wave that continued in the original direction).

Current traveling waves may be measured by current transformers, which may be installed at the ends of transmission lines in substations. Current transformers typically have enough fidelity to measure current traveling waves with adequate accuracy for practical protection and fault locating applications. However, a current transformer measures the current at the point of its installation at the line terminal which is always a discontinuity in the characteristic impedance, and therefore it measures the sum of the incident and reflected current traveling waves. It does not measure the incident wave separately and it does not allow separating of the waves into incident, reflected, and transmitted waves.

Voltage transformers presently used in electric power systems may lack sufficient fidelity to measure voltage traveling waves with adequate accuracy. Accordingly, various embodiments disclosed herein may comprise current transformers and a variety of techniques to determine a voltage signal based on measurements from the current transformers.

Because the voltage and current traveling waves are linked with the characteristic impedance of the line, it is possible to separate any given traveling wave into the incident, reflected and transmitted components. This separation is performed using the well-known equations:

$$v_{incident} = \frac{V_{TW} - i_{TW}Z_c}{2}$$ Eq. 2

$$v_{reflected} = \frac{V_{TW} + i_{TW}Z_c}{2}$$

or $$i_{incident} = \frac{V_{TW}/Z_c - i_{TW}}{2}$$

$$i_{reflected} = \frac{V_{TW}/Z_c + i_{TW}}{2}$$

However, to perform the wave separation systems and methods consistent with the present disclosure aims to accurately measure both the total current traveling wave ($i_{TW}$) and the voltage traveling wave ($V_{TW}$) at a given termination point on the line. Conventional current transformers may provide sufficiently accurate current traveling wave measurements, but conventional voltage transformers may not provide enough fidelity to measure voltage traveling waves.

Wave separation into the incident, reflected, and transmitted traveling waves may allow better utilization of the traveling wave information as compared with using just traveling wave measurements from current transformers, which are the sums of the incident and reflected waves. The following are examples of advanced applications when the incident, reflected, and transmitted traveling waves are individually available (separated).

Single-ended traveling wave fault locating methods may be improved because such systems may be able to identify direction of each received wave. This may allow a system to differentiate waves from a short circuit or from discontinuities on the line in the forward direction from waves arriving from behind the fault locating terminal.

Single- and multi-ended traveling wave fault locating methods may be improved by improving such systems' abilities to accommodate different types of line terminations. For example, when the terminating impedance is infinity (e.g., an open breaker or an inductor behind the terminal) the current measurement is zero and the incident and reflected current waves cancel. However, when looking at the separated incident wave and reflected waves, the fault locator has a reliable non-zero signal to analyze.

Traveling wave differential protection methods may be improved by separating traveling waves by having higher and more reliable traveling wave operating signals. This is particularly true for lines terminated with a high characteristic impedance, because such lines may be yielding a low or zero current wave measurement. Additionally, these schemes are more secure when working with incident waves by verifying the direction of each arriving traveling wave in a manner similar to the single-ended fault locators. Traveling wave distance elements may also be improved by using separated waves.

In various embodiments consistent with the present disclosure, high-fidelity voltage measurements may be subsequently filtered using a differentiator-smoother technique or other techniques appropriate for extracting traveling waves. Further, in various embodiments current and voltage traveling waves may be separated into incident, reflected, and transmitted waves. Specifically, the present disclosure is concerned with using a capacitance-coupled voltage transformer (CCVT) for obtaining high-fidelity voltage signals. The standard output voltage of a CCVT has a limited bandwidth and it does not provide high-fidelity voltage output.

In another aspect of this disclosure, the high-fidelity line voltage signal may improve the security and the operating time of distance (impedance) elements. During short-circuits the CCVT secondary voltage contains low-frequency components that may be as high as 40% of the nominal voltage and may last one to several power system cycles. During some fault conditions, the true secondary voltage may be a small percentage of the nominal voltage for high source-to-impedance ratio conditions. The large low-frequency transient components generated by the CCVTs may prevent impedance relays from measuring the true voltage with sufficient accuracy. As a result, these relays may lose security and/or operate slowly for in-zone faults. Supplying these impedance relays with voltage that is free from the CCVT-induced transients considerably improves security and speed of impedance protection.

In yet another aspect of this disclosure, the systems and methods disclosed herein may be utilized to monitor CCVT systems for failures. A CCVT can explode if capacitor elements fail and arcing occurs. Such an explosion can create hazardous projectiles and throw off hot oil, both of which pose a significant hazard to persons and property in proximity. The CCVT projectiles can cause damage to other elements in the substation, starting an avalanche of failures which may put human life in danger. The hazards associated with a CCVT can increase as the CCVT ages and capacitive elements become more likely to fail, especially if the CCVT operating ambient temperatures are high. By comparing the standard CCVT output voltage and the high-fidelity voltage, the systems and methods disclosed herein may detect CCVT failures and implement protective action to avoid explosions.

The systems and methods disclosed herein may be added to existing electric power systems, in addition to being included in newly installed systems. In certain embodiments, the systems and methods disclosed herein may be added to existing systems to provide high-fidelity voltage measurements.

FIG. 1 illustrates a simplified diagram of a system 100 including a CCVT consistent with the present disclosure. A capacitor stack 113 is in electrical communication with a high voltage portion 102 and a low voltage portion 103 and is connected between a primary voltage terminal 101 and a substation ground 104. A traveling wave 114, $i_{TW}$, may propagate through voltage terminal 101. A primary current measurement device 115 may detect the traveling wave 114 as it passes and may detect information about the traveling wave that may be used in connection with various embodiments disclosed herein.

The capacitor stack 113 creates a capacitive voltage divider and produces an intermediate voltage at the tap terminal 105. In various embodiments, the primary voltage may be 110 kV and above, and may include 750 kV and 1 MV networks. The intermediate voltage may be in the range of 5-30 kV. A step-down transformer 107 further steps down the intermediate voltage to a standard secondary voltage at the output CCVT terminals 109. The standard secondary voltage may be in the range of 60-250 V in various embodiments.

A direct connection of a step-down transformer to a capacitor stack may introduce an angle measurement error. To reduce that error, a tuning reactor 106 is connected in series between the intermediate voltage terminal in the capacitive divider 105 and the step-down transformer 107. A connection of the step-down transformer 107 and the capacitors 102 and 103 would create a danger of ferroresonance. A ferroresonance is a self-exciting and potentially destructive oscillation between the non-linear magnetizing branch of the step-down transformer 107 and the capacitors 102 and 103. To prevent ferroresonance, a ferroresonance suppression circuit (FRSC) 108 is connected to the secondary winding of the step-down transformer 107. The output voltage at the CCVT secondary terminals 109 is connected via control cables 110 to the input terminals 111 of the end device 112 such as a protective relay, R. The connection at the end device 112 typically includes a safety ground 114.

System 100 acts inadvertently as a band-pass filter. System 100 passes the fundamental frequency component (typically 50 or 60 Hz) with the nominal transformation ratio and small magnitude and angle errors. The components of system 100 considerably attenuate frequencies below the nominal power system frequency as well as high frequencies. In addition, the CCVT produces transient components in the spectrum close to the nominal frequency that may impair the operation of the impedance protection as mentioned above.

For very high frequency components, such as voltage traveling waves, an ideal tuning reactor 106 behaves as an open circuit, and therefore it does not pass any very high frequency signals to the step-down transformer 107. Similarly, an ideal step-down transformer 107 is an open circuit for very high frequencies, and as such, it also prevents any high-frequency signals from being passed to the low voltage side 109 of the step-down transformer 107. As a result, the end-device 112 does not receive high-frequency signals associated with traveling wave 114 at its terminals 111. In practice, however, the tuning reactor 106 has some parasitic inter-turn capacitance, which may also be called stray capacity. Similarly, the windings of the step-down transformer 107 also include parasitic capacitance.

Various embodiments consistent with the present disclosure may utilize measurements from primary current measurement device 115 along with additional measurements associated with capacitor stack 113 to analyze current measurement device. Such systems and methods may, use such information to separate traveling wave signals into incident traveling waves and reflected traveling waves using Eq. 2, and providing distance protection. Voltage and current measurements may also be used to provide impedance based protection. Further, such systems and methods may provide improved impedance protection by reducing or eliminating CCVT transients near the fundamental power system frequency.

Figure 2:
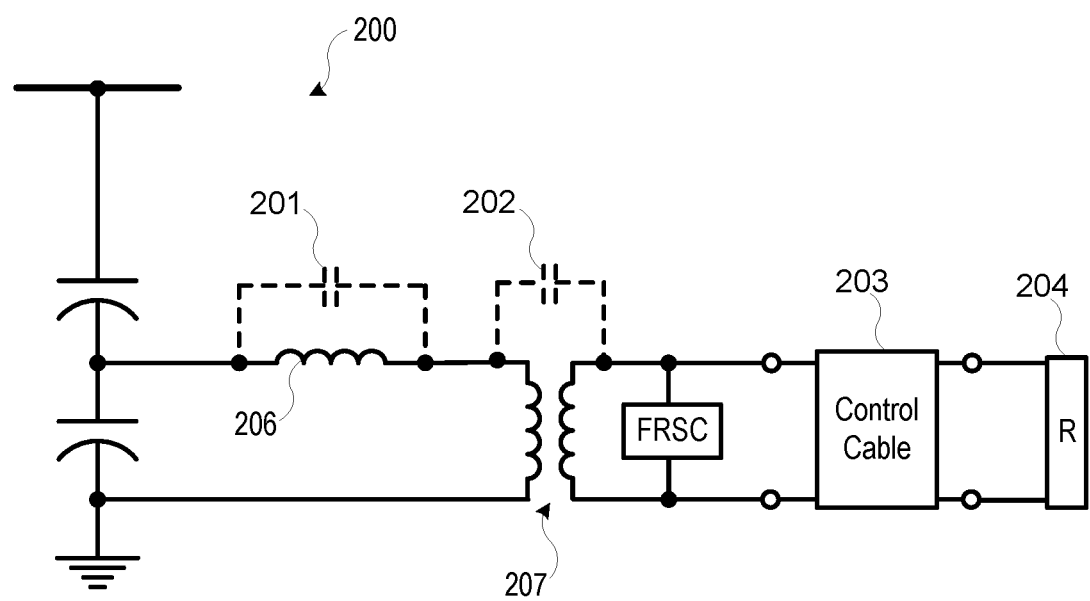
FIG. 2 shows a simplified circuit diagram of a CCVT system including parasitic capacitances, which are illustrated in dashed lines, and are associated with a tuning reactor and step-down transformer, consistent with embodiments of the present disclosure.

FIG. 2 shows a simplified circuit diagram of a CCVT system 200 including parasitic capacitances, which are illustrated in dashed lines, and are associated with a tuning reactor 206 and step-down transformer 207, consistent with embodiments of the present disclosure. Capacitance 201 results from the turn-to-turn capacitance of the coil that makes up the tuning reactor 206. Capacitance 202 results from the turn-to-turn and inter-winding capacitances of the step-down transformer 207

Capacitance in system 200 creates a path for the high-frequency signal components to pass through system 200. Capacitance 201 provides a path through the tuning reactor 206 for high frequency signals. Capacitance 202 creates a path for the high-frequency signal components to pass to the low voltage side of the step-down transformer.

The control cable 203 has a complex frequency response, but it allows high-frequency components—although the signal may include artifacts and distortions—to reach the end-device 204, R. However, the stray capacitances 201, 202 do not result in delivering a faithful replica of the high-frequency component in the primary voltage to the end device 204. The end device 204 may see the correct polarity of the very first wave, and a ringing afterwards. This is enough to allow application of a traveling wave protection element, but such a signal may not allow measuring individual voltage traveling waves with high fidelity.

Figure 3:
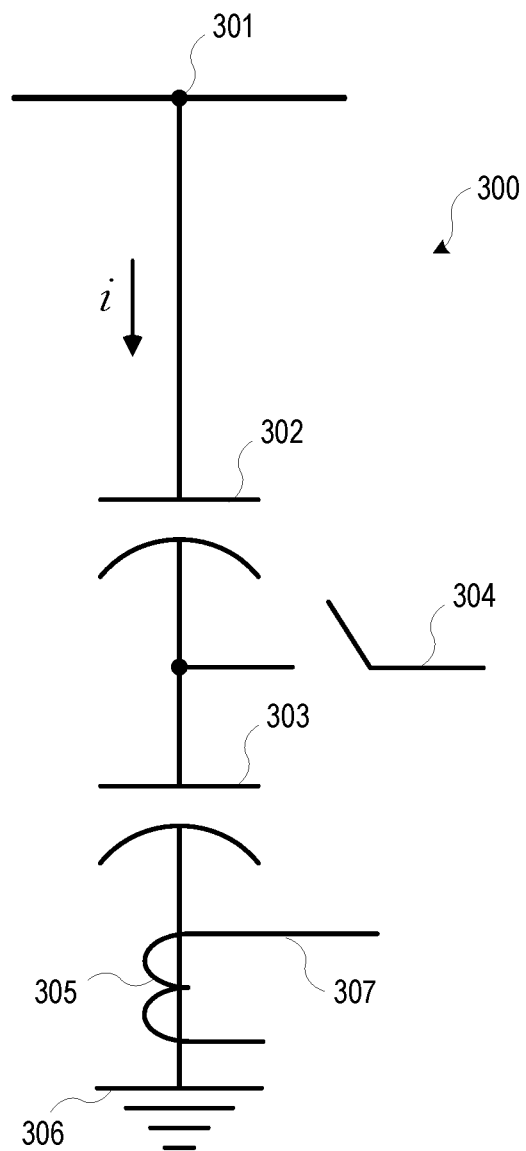
FIG. 3 illustrates a diagram of a CCVT capacitive divider stack with a low-ratio current transformer installed near the grounding point 306 consistent with embodiments of the present disclosure.

FIG. 3 illustrates a simplified diagram of a CCVT system 300 at high frequencies with a low-ratio current transformer 305 installed near the grounding point 306 consistent with embodiments of the present disclosure. In the first approximation, the tuning reactor, which is not shown, can be considered as an open circuit, in spite of its stray capacitance. The circuit toward the tuning reactor is represented by an open switch 304. A current flowing through an ideal capacitor is proportional to the derivative (d/dt) of the voltage across the capacitor. The primary voltage 301 (v), the CCVT capacitors 302 and 303, and the current (i) measured via the current transformer 307 having the ratio of N, is shown by Eq. 3:

$$N \cdot i = (C_1 + C_2)\frac{dv}{dt} \quad \text{Eq. 3}$$

Eq. 3 may be expressed in terms of voltage, as shown in Eq. 4.

$$v = \frac{N}{(C_1 + C_2)}\int i\, dt \quad \text{Eq. 4}$$

Eq. 4 constitutes a measurement of the voltage in the high frequency bandwidth; specifically, it provides voltage traveling waves. Eq. 4 does not reproduce the voltage in the wide frequency range because it neglects the current difference between the high voltage capacitor 302 and low voltage capacitor 303, i.e. the current diverted to the tuning reactor. The voltage signal of Eq. 4 may be referred to as a high-frequency voltage. In certain embodiments, systems consistent with the present disclosure may use a differentiator-smoother filter to extract traveling waves from the raw signals. Further, some embodiments may apply a cascade of a numerical differentiator and a numerical smoother. In these implementations, the numerical voltage derivative (voltage differentiator) can be replaced with the current measurement as per Eq. 3, followed by a numerical smoother. In other words, Eq. 4 may not be utilized in these implementations. Rather, these implementations may use the current measured in the capacitor stack as a voltage derivative when extracting voltage traveling waves.

The values of $C_1$, $C_2$, and N parameters in Eq. 3 and Eq. 4, if not known and provided as settings, may be determined by the system consistent with this disclosure. In various embodiments, the secondary output from the CCVT may also be monitored. Eq. 4 will match the secondary CCVT output in a steady state. By comparing the two voltages in the steady state the system determines the values of $C_1$, $C_2$, and N.

Current transformer 307 may be installed anywhere in the capacitor stack in various embodiments; however, the location that is easiest to access in retrofit installations, and poses least insulation requirements for the current transformer, is between the low voltage stack and the ground. That connection may be accessible to operators and is at zero potential to ground. In various embodiments, the current transformer 305 may be embodied as a clamp on current transformer. Further, the current transformer 303 may comprise a spit-core transformer that opens its core to insert the conductor through the magnetic window or may be embodied as a regular transformer by undoing the neutral connection of the CCVT, passing the grounding wire through the solid current transformer window, and reconnecting the grounding wire. A split-core transformer may be more readily applied in retrofit installations. The present disclosure is not limited to any specific type of current measurement device; other current measurement systems can be used, such as including resistive or capacitive shunts.

In one embodiment, a system may measure current and integrate it into voltage as per Eq. 4. In such embodiments, various numerical procedures may be employed to achieve stable and accurate integration. For example, the integrated voltage may follow the secondary voltage in the narrow frequency band of the CCVT. Accordingly, the secondary voltage output of the CCVT may be compared to the integration to remediate instability or inaccuracy.

Figure 4:
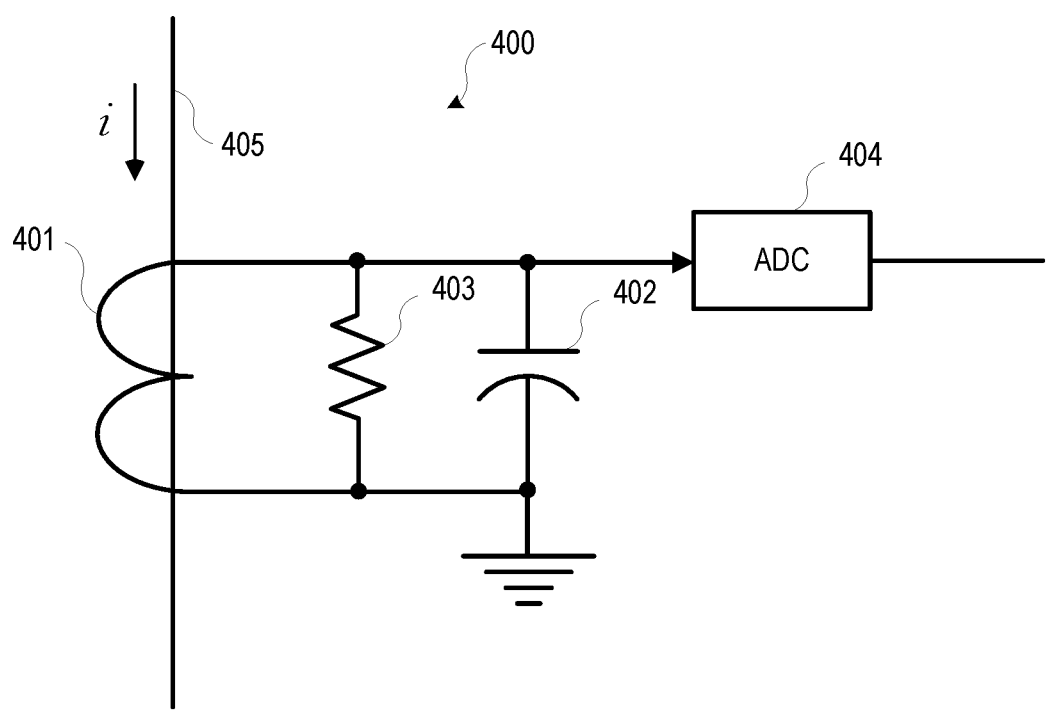
FIG. 4 illustrates a simplified circuit diagram of a system 400 to monitor a current flow, i, through a CCVT stack consistent with embodiments of the present disclosure.

FIG. 4 illustrates a simplified circuit diagram of a system 400 to monitor a current flow, i, through a CCVT stack consistent with embodiments of the present disclosure. In the illustrated embodiment, a low-ratio current transformer 401 is connected to a capacitor 402 and a resistor 403. The voltage across the capacitor 402 is proportional to the integral of the current signal created by transformer 401. The voltage across the capacitor 402 may be used as the integral in Eq. 4 to determine a voltage signal associated with line 405. The analog-to-digital converter 404 (ADC) may convert the analog signal to a digital signal that may be used by IEDs, control systems, and other components in an electric power system. As will be appreciated by those having skill in the art, electrical insulation between the secondary winding of the transformer 401 and the ADC 404 and downstream electronics is provided but is not illustrated in the interest of simplicity. In various embodiments, the insulation may comprise galvanic insulation, which may further isolate ADC 404 from the secondary windings of a transformer.

Figure 5:
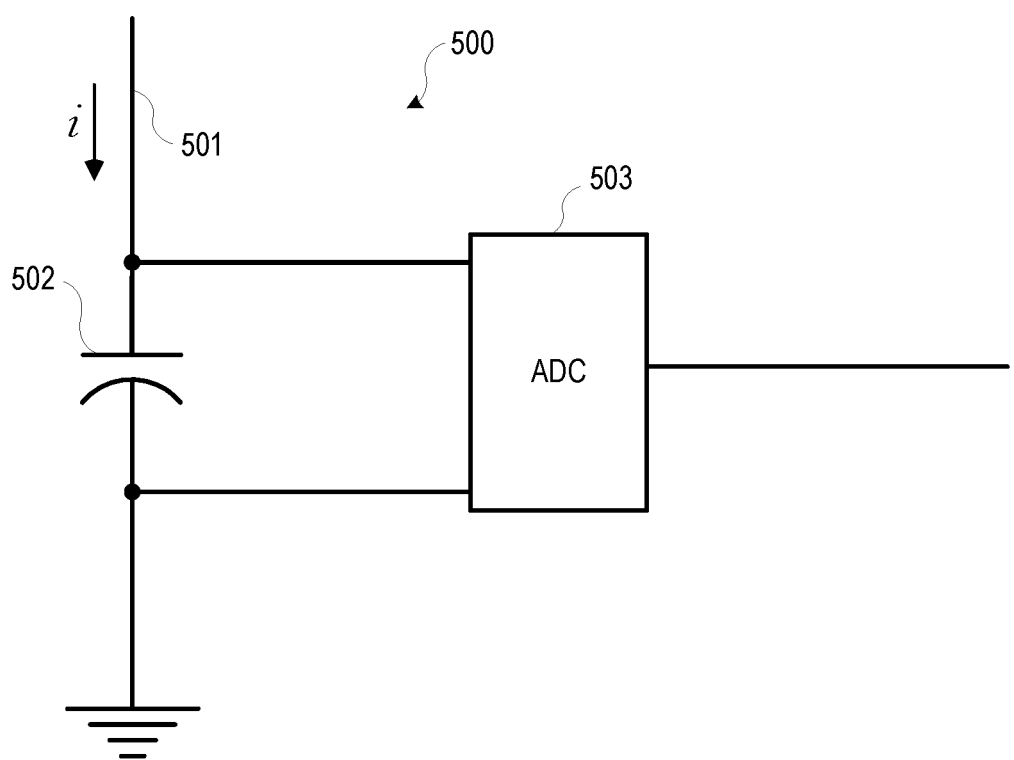
FIG. 5 illustrates a simplified circuit diagram of a system to monitor a current flow, i, through a CCVT stack consistent with embodiments of the present disclosure.

FIG. 5 illustrates a simplified circuit diagram of a system 500 to monitor a current flow, i, through a CCVT stack 501 consistent with embodiments of the present disclosure. The capacitor 502 creates a voltage drop that is proportional to the integral of the current. The signal across capacitor 502 may be used in connection with Eq. 4 to determine a voltage signal. The signal may be measured by ADC 503 and may be used to determine a voltage signal for use in connection with detection of traveling waves and other applications. Since the capacitor 502 may be inserted in series with the capacitor stack it is important to make sure that its insertion does not affect the original CCVT tuning. This is accomplished by ensuring that the voltage drop across the capacitor 502 under nominal primary voltage is sufficiently small (e.g., approximately 2 V).

The frequency response of system 400 illustrated in FIG. 4 and system 500 illustrated in FIG. 5 are suitable for detecting high-frequency signals, such as traveling waves; however, lower-frequency signals may be attenuated by the frequency response of systems 400 and 500. In various embodiments, a second current measurement device may be used to increase the bandwidth over which signals may be monitored. In various embodiments, the frequency range may extend from a few Hz (e.g., approximately 5 Hz) to a few hundred kHz (e.g., 500,000 Hz). This frequency range may be enabled by sampling at a range of 1 MHz or greater.

In various embodiments, a second current measurement device may measure the current diverted from the low voltage capacitor stack toward the tuning reactor and the step-down transformer. At lower frequencies, this current is not negligible. Further, although the current may be small at high frequencies, the current is not zero. As such, multiple current measurement devices may improve the accuracy of systems consistent with the present disclosure for high-frequency signals.

Figure 6A:
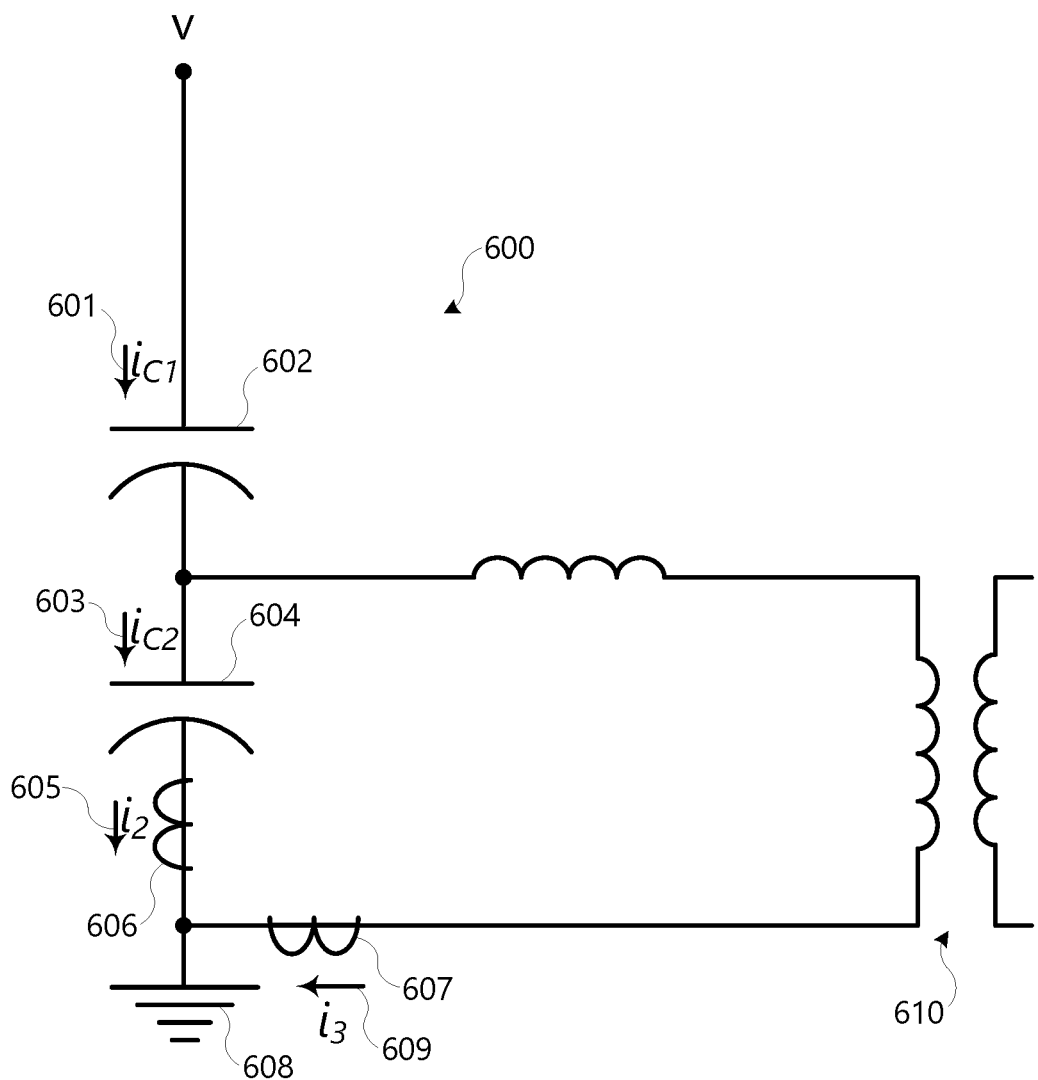
FIG. 6A illustrates a simplified diagram of a system to determine a voltage signal based on current measurements in a CCVT consistent with embodiments of the present disclosure.

FIG. 6A illustrates a simplified diagram of a system 600 to determine a voltage signal based on current measurements in a CCVT consistent with embodiments of the present disclosure. In the illustrated embodiment, a first current transformer 606 is installed in series with the low voltage capacitor 604 in a CCVT. A second current transformer 607 is located in the return connection from a step-down transformer 610. The current transformers 606 and 607 may be installed near the ground 608 for various reasons, including the low electrical potential and the accessibility of the wires. One or both of current transformers 606 and 607 may be embodied as a clamp-on transformer in various embodiments.

Using Kirchoff's current law, the currents through transformers 606 and 607 may be expressed as a function of the current 601 through capacitor 602, as shown in Eq. 5.

$$i_{C1} = i_2 + i_3 \qquad \text{Eq. 5}$$

The current flowing through capacitor 602 is the same current $i_2$ 605, as expressed in Eq. 6.

$$i_{C2} = i_2 \qquad \text{Eq. 6}$$

Having the currents in capacitors 602 and 604, the voltage may be calculated using Eq. 7.

$$v = \frac{1}{C_1} \int i_{C1} dt + \frac{1}{C_2} \int i_{C2} dt \qquad \text{Eq. 7}$$

Eq. 7 provides an accurate representation of the voltage in a wide frequency range.

Figure 6B:
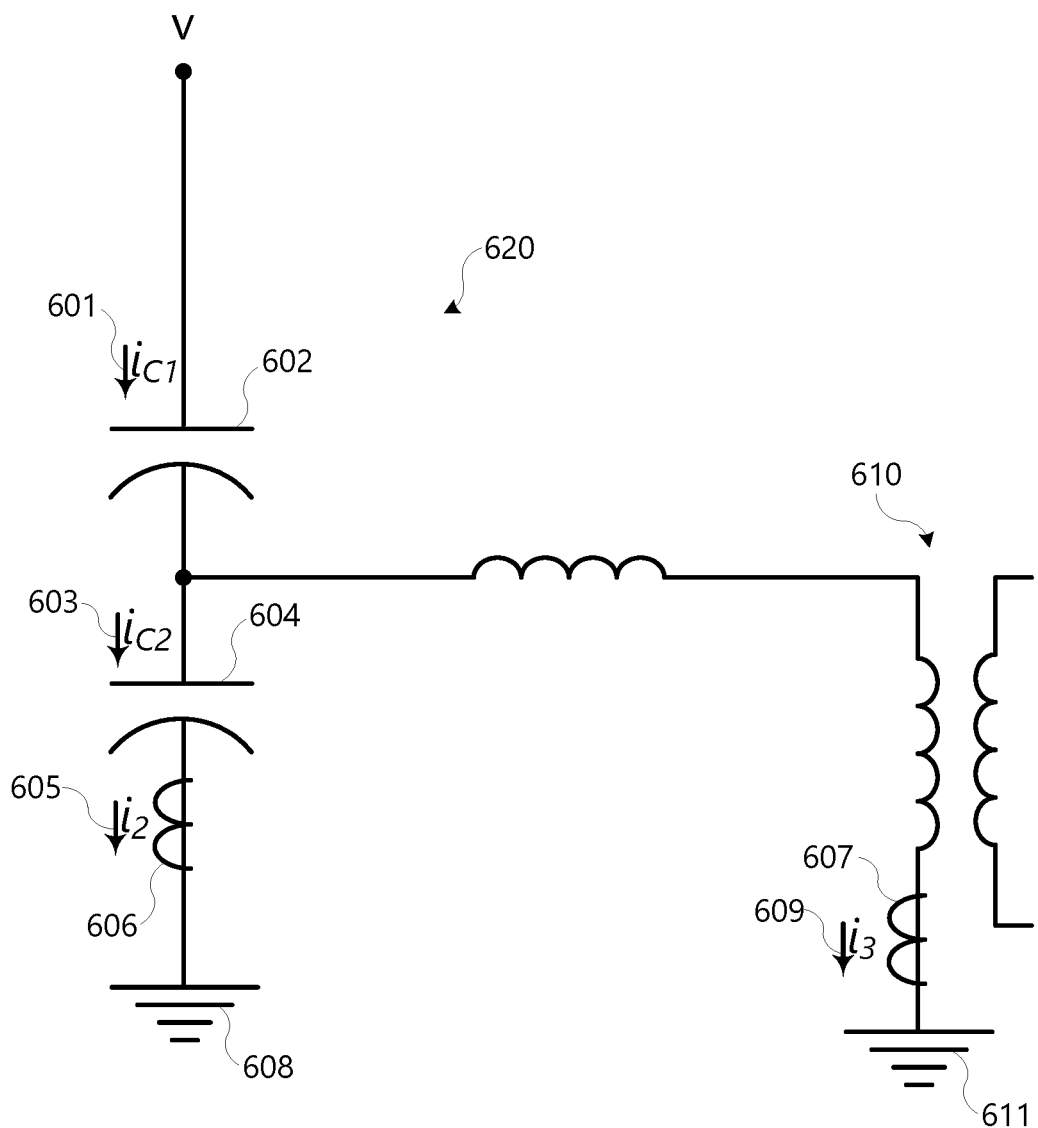
FIG. 6B illustrates a simplified diagram of a system to determine a voltage signal based on current measurements in a CCVT consistent with embodiments of the present disclosure.

FIG. 6B illustrates a simplified diagram of a system 620 to determine a voltage signal based on current measurements in a CCVT consistent with embodiments of the present disclosure. In contrast to the system 600 illustrated in FIG. 6A, system 620 has a different grounding configuration. FIG. 6B illustrates a return connection of a step-down transformer 610 connected to ground 611. In the embodiment of FIG. 6B, the current transformer 607 is located between the step-down transformer 610 and the ground connection 611. Eq. 7 may be used with Eq. 6 and Eq. 5 to determine a voltage signal for use in connection with the systems and methods disclosed herein. FIG. 6B also illustrates that various CCVTs may have wiring configurations which are similar to and/or different from the examples illustrated in the present disclosure. It is understood that the present disclosure anticipates that a variety of wiring configurations are possible, and the system can be easily configured to accommodate the anticipated variety of wiring configurations.

Figure 6C:
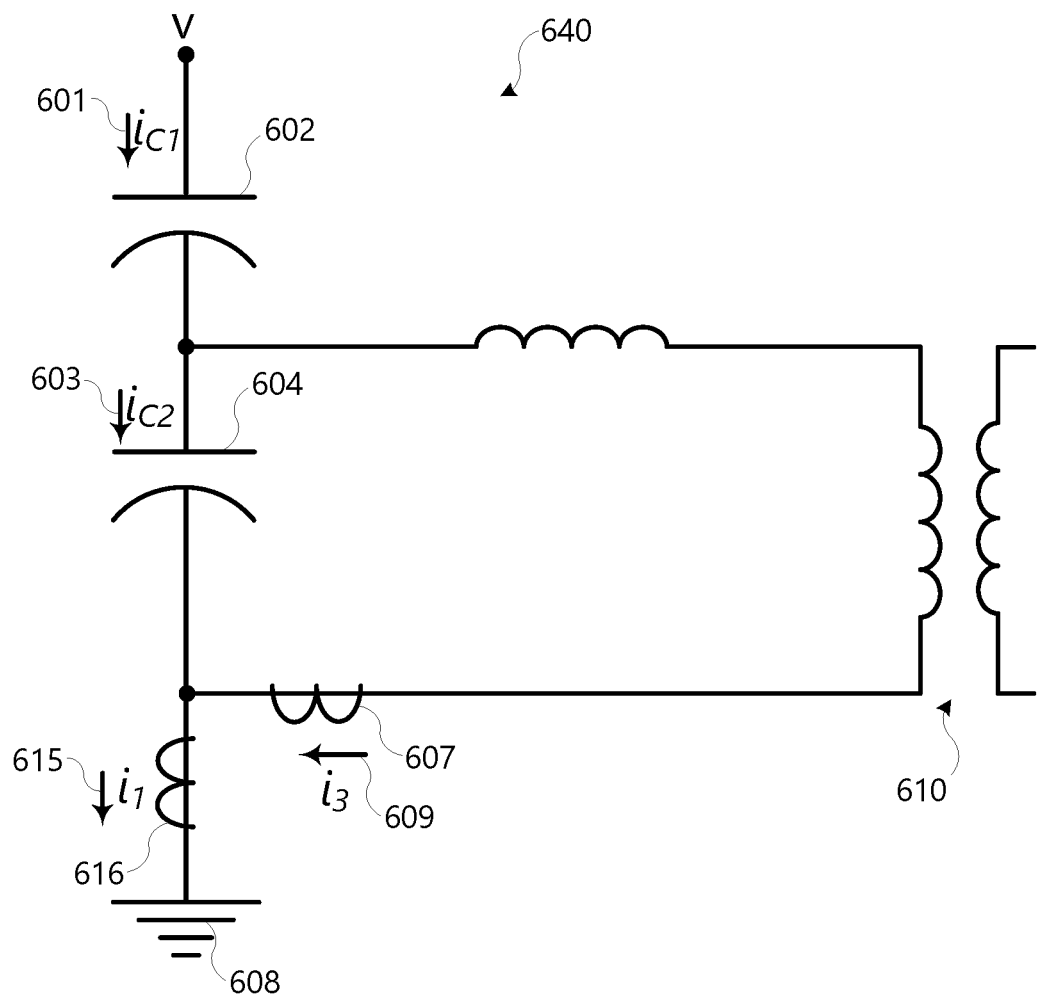
FIG. 6C illustrates a simplified diagram of a system to determine a voltage signal based on current measurements in a CCVT consistent with embodiments of the present disclosure.

FIG. 6C illustrates a simplified diagram of a system 640 to determine a voltage signal based on a current measurement in a CCVT consistent with embodiments of the present disclosure. In contrast to system 600 illustrated in FIG. 6A, system 640 illustrated in FIG. 6C has the second current transformer 616 installed in the ground connection rather than in the low portion of the capacitor stack.

Using Kirchoff's current law, the current through transformer 616 may be expressed as a function of the current through capacitor 602, as shown in Eq. 8.

$$i_{C1}=i_1 \qquad \text{Eq. 8}$$

The current through capacitor 604 may be expressed using Eq. 9.

$$i_{C2}=i_1-i_3 \qquad \text{Eq. 9}$$

Eq. 9 may be used with Eq. 8 and Eq. 7 to determine a voltage signal for use in connection with the systems and methods disclosed herein.

Figure 6D:
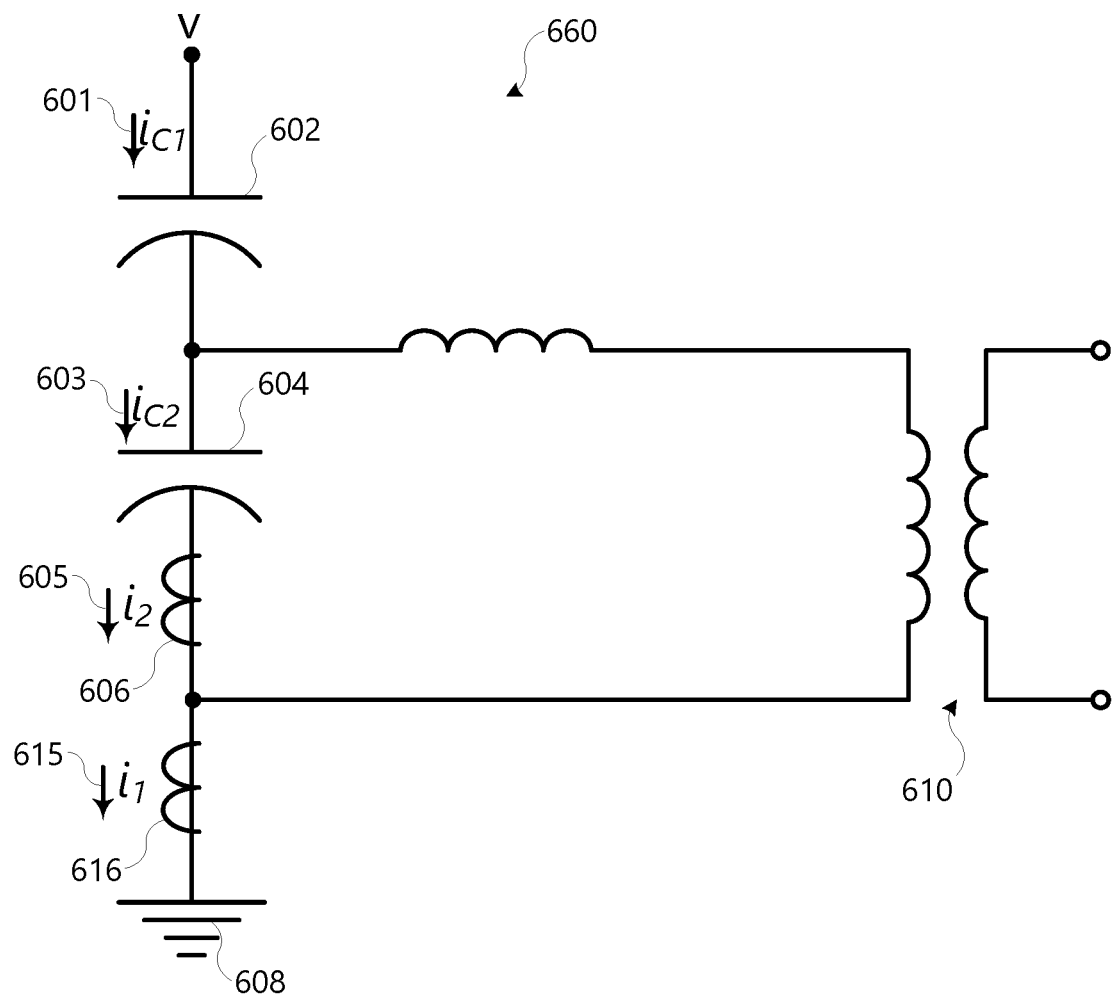
FIG. 6D illustrates a simplified diagram of a system to determine a voltage signal based on current measurements in a CCVT consistent with embodiments of the present disclosure.

FIG. 6D illustrates a simplified diagram of a system 660 to determine a voltage signal based on a current measurement in a CCVT consistent with embodiments of the present disclosure. Using Kirchoff's current law, the current $i_1$ 615 through transformer 616 may be expressed as a function of the current $i_{C1}$ 601 through capacitor 602, as shown in Eq. 10.

$$i_{C1}=i_1 \qquad \text{Eq. 10}$$

The current ice 603 through capacitor 604 may be expressed using Eq. 11.

$$i_{C2}=i_2 \qquad \text{Eq. 11}$$

Eq. 11 may be used with Eq. 10 and Eq. 7 to determine a voltage signal for use in connection with the systems and methods disclosed herein.

In connection with the systems illustrated in FIGS. 6A, 6B, 6C, and 6D, current transformers, resistive shunts, or capacitive shunts may be utilized. Such systems may integrate the currents into voltage digitally or in the analog fashion, such as using a capacitor burden for the current transformers.

Figure 7A:
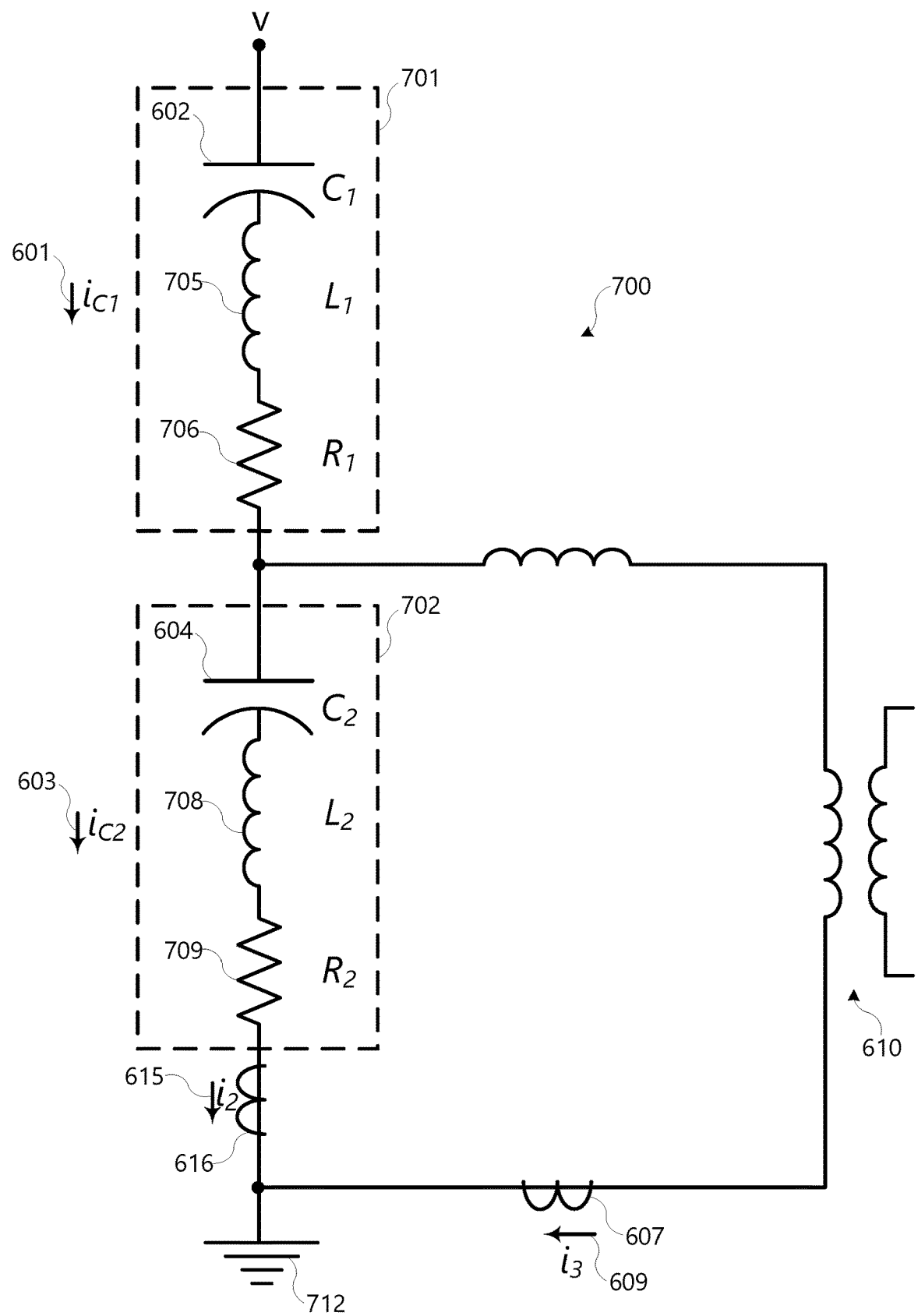
FIG. 7A illustrates a simplified diagram of a system to determine a voltage signal based on a current measurement in a CCVT consistent with embodiments of the present disclosure.

FIG. 7A illustrates a simplified diagram of a system 700 to determine a voltage signal based on current measurements in a CCVT consistent with embodiments of the present disclosure. The embodiments illustrated in FIG. 7A may be used to account for various parasitics in a capacitor stack for calculation of a high-fidelity voltage. In contrast to system 600 illustrated in FIG. 6A, the capacitors 701 and 702 are shown with equivalent series resistances R1 706 and R2 709 and equivalent series inductances L1 705 and L2 708. In some embodiments, Eq. 7 may not be valid over a frequency range of interest, and integration of currents through ideal capacitors C1 602 and C2 604 may not be an accurate representation of the voltage across the capacitors. Accordingly, a more accurate model of the CCVT may be employed such as illustrated in FIG. 7A. The voltage may be calculated as shown in Eq. 12.

$$v = \left[L_1\frac{di_{C1}}{dt} + R_1 i_{C1} + \frac{1}{C_1}\int i_{C1}dt\right] + \left[L_2\frac{di_{C2}}{dt} + R_2 i_{C2} + \frac{1}{C_2}\int i_{C2}dt\right] \qquad \text{Eq. 12}$$

Although FIG. 7A illustrates a particular embodiment of a system to determine a voltage signal based on current measurements in a CCVT, different embodiments are contemplated. For example, instead of modeling the CCVT capacitors as a series R-L-C circuit, other models may be used which may employ any number of elements in any configuration.

Figure 7B:
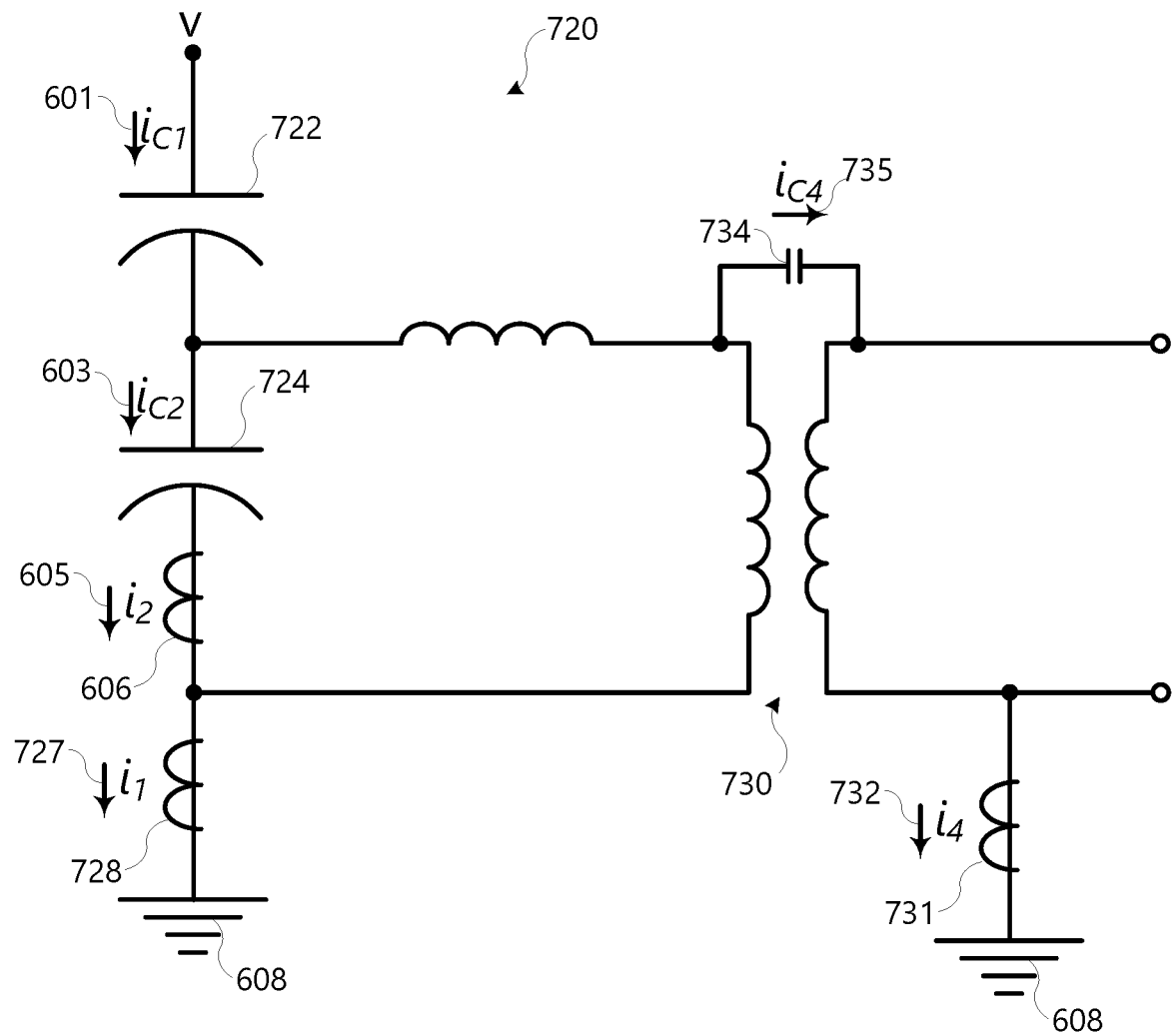
FIG. 7B illustrates a simplified diagram of a system to determine a voltage signal based on a current measurement in a CCVT consistent with embodiments of the present disclosure.

FIG. 7B illustrates a simplified diagram of a system 720 to determine a voltage signal based on a current measurement in a CCVT and to obtain measurements useful to monitor CCVT health consistent with embodiments of the present disclosure. In comparison to FIG. 7A, the system 720 illustrates parasitic capacitance 734 which conducts current $i_{C4}$ 735, which is related through Kirchoff's law to the parasitic current 732, which is measured using current transformer 731. Using Kirchoff's current law, the current $i_{C1}$ through capacitor 722 may be expressed as a function of the currents $i_1$ 727 and $i_4$ 732 through transformers 728 and 731, as shown in Equation 8.

$$i_{C1}=i_1+i_4 \qquad \text{Eq. 13}$$

While FIG. 7B illustrates a parasitic capacitance of the step-down transformer 730, it is understood that other parasitic current paths may exist and can be measured to improve the calculation of current through the CCVT capacitors 722 and 724. The step-down transformer 730 may include secondary contacts that may be useful to provide a voltage signal proportional to a voltage on the electric power system. The step-down transformer 730 may include a tuning reactor, such as described hereinafter. Alternatively, some CCVTs may have internal ground connections or other non-parasitic components which operate as current paths to ground. Measurement of other currents and voltages in the CCVT may be required to accurately calculate a current through a capacitor element of the capacitor stack. Furthermore, some current paths may be predictable, and their effects on the current in the capacitor stack may be calculated or estimated indirectly rather than measured.

Figure 7C:
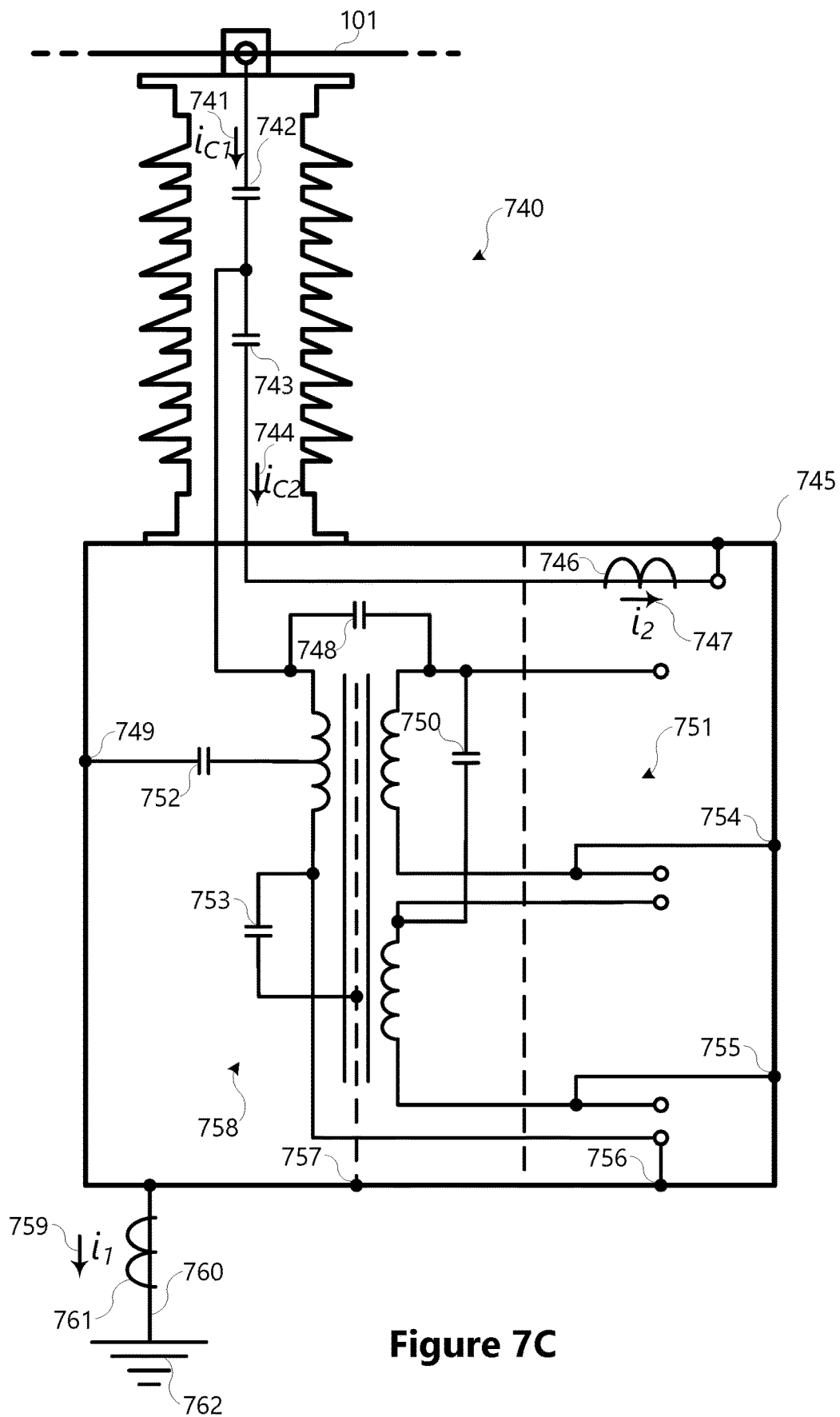
FIG. 7C illustrates a simplified diagram of a system to determine a voltage signal based on a current measurement in a CCVT consistent with embodiments of the present disclosure.

FIG. 7C illustrates a diagram of a system 740 to determine a voltage signal based on a current measurement in a CCVT and to obtain measurements useful to monitor CCVT health consistent with embodiments of the present disclosure. In comparison to FIG. 7B, the system 740 illustrates parasitic capacitances 748, 750, 752, and 753 which collectively conduct current from capacitor 742 to CCVT secondary terminal box 745. Furthermore, several non-parasitic connections 749, 754, and 755 conduct current from capacitor 742. The CCVT secondary terminal box 745 may be divided into accessible region 751 and inaccessible region 758. Accordingly, it may be difficult to measure the effects of current paths in the inaccessible region 758 such as current through chassis connections 757 and 749. The CCVT secondary terminal box 745 is connected to ground 762 through an external ground lead 760. In this embodiment, current transformer 761 measures current $i_1$ 759 through the ground lead 760. This allows the currents through all parasitic and non-parasitic chassis connections 749, 750, 752, 753, 757, 754, 755 and 756 to be measured and used to accurately calculate the current $i_1$ 759 through capacitor 742.

Using Kirchoff's current law, the current $i_{C1}$ through capacitor 741 may be expressed as a function of the current through transformer 761, as shown in Equation 14.

$$i_{C1}=i_1 \qquad \text{Eq. 14}$$

The current ice 744 through capacitor 743 may be expressed as the current $i_2$ through transformer 746 using Equation 15.

$$i_{C2}=i_2 \qquad \text{Eq. 15}$$

Equations 15, 14, and 7 may be used to determine a voltage signal from the current signals $i_1$ and $i_2$ 747 determined by current transformers 761 and 746. Accordingly, a high-fidelity voltage signal may be obtained using measurements from accessible portions of the CCVT, even in the presence of parasitic and non-parasitic chassis connections, and even when portions of the CCVT are not accessible.

Figure 8A:
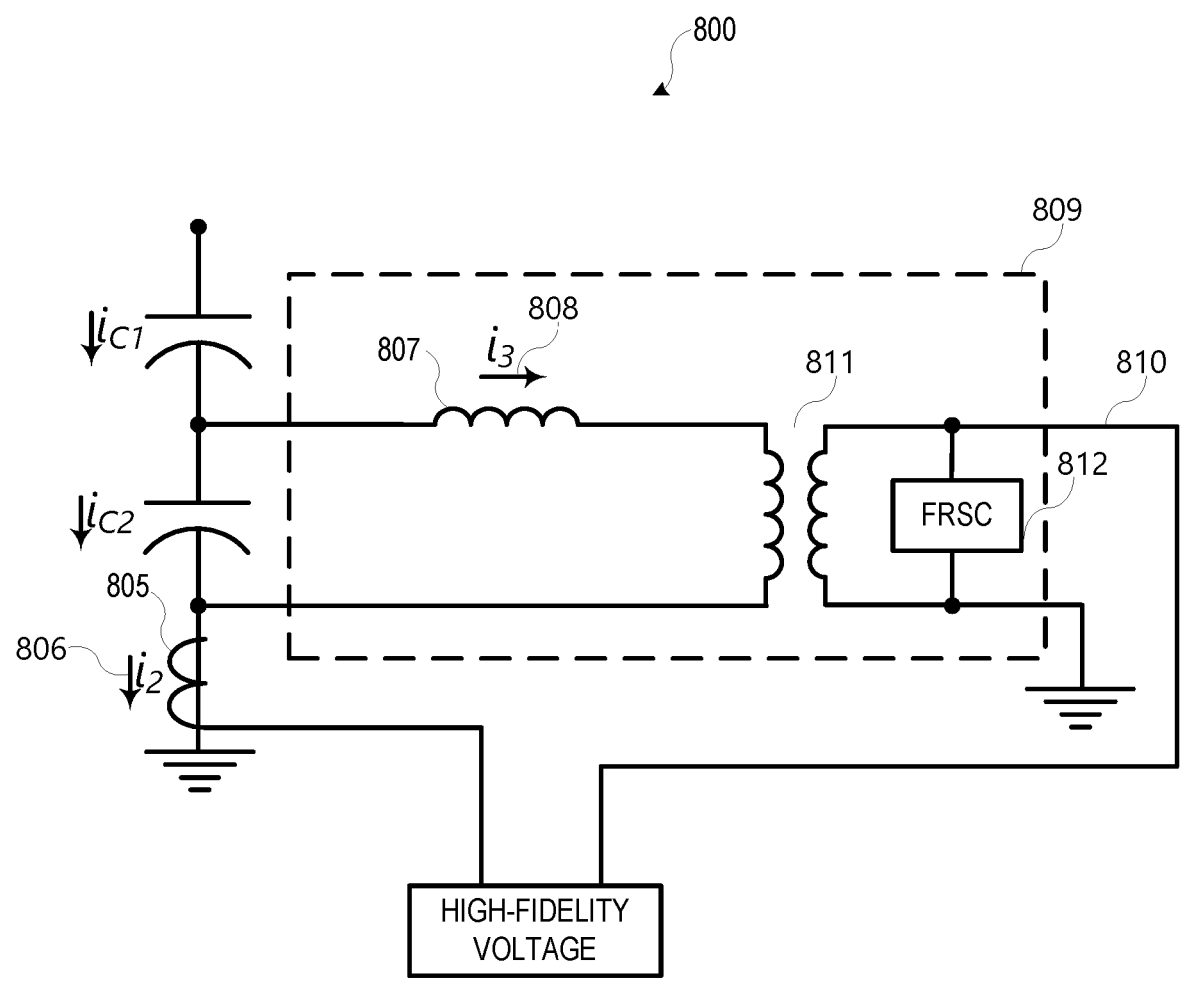
FIG. 8A illustrates a simplified diagram of a system to determine a voltage signal based on a current measurement in a CCVT consistent with embodiments of the present disclosure.

FIG. 8A illustrates a diagram of a system 800 to determine a voltage signal based on a current measurement in a CCVT and to obtain measurements useful to monitor CCVT health consistent with embodiments of the present disclosure. In contrast to the systems illustrated in FIGS. 6A, 6B, 6C, 7A, 7B, and 7C, the system 800 in FIG. 8A calculates a high-fidelity voltage based on only one current measurement in the CCVT. The high-fidelity voltage is calculated using the current $i_2$ 806 measured by current transformer 805 and the CCVT secondary voltage 810. The current $i_3$ 808 can be estimated from the CCVT secondary voltage 810 by considering the secondary step-down transformer 811, ferroresonance suppression circuit (FRSC) 812 and tuning reactor 807 as being a single functional block 809 with s-domain transfer function, F(s), that accepts current $i_3$(s) 808 as an input and produces the CCVT secondary voltage, $V_{SEC}$(s), 810 as the output as shown in Equation 16.

$$V_{SEC}(S)=i_3(s) \cdot F(s) \qquad \text{Eq. 16}$$

The current $i_3$ 808 may be represented as a function of the CCVT secondary voltage 810 as shown in Equation 17.

$$i_3(s) = \frac{V_{SEC}(s)}{F(s)} \qquad \text{Eq. 17}$$

Alternatively, Equation 17 can be expressed in the time-domain using the Inverse Laplace Transform as shown in Equation 18.

$$i_3(t) = L^{-1}\left(\frac{V_{SEC}(s)}{F(s)}\right) \qquad \text{Eq. 18}$$

Eq. 18 can be used with Eq. 5, Eq. 6, and Eq. 7 to determine a voltage signal for use in connection with the systems and methods disclosed herein.

Figure 8B:
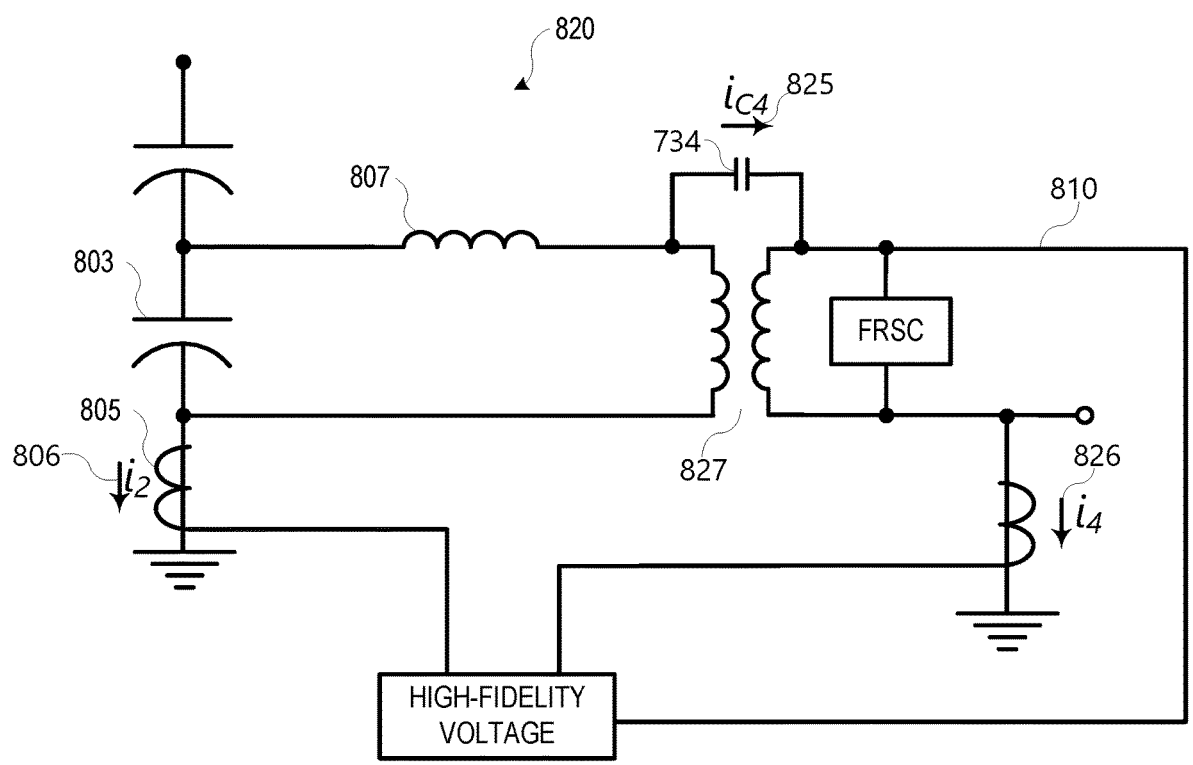
FIG. 8B illustrates a simplified diagram of a system to determine a voltage signal based on a current measurement in a CCVT consistent with embodiments of the present disclosure.

FIG. 8B illustrates a diagram of a system 820 to determine a voltage signal based on a current measurement in a CCVT and to obtain measurements useful to monitor CCVT health consistent with embodiments of the present disclosure. In contrast to the system 800 illustrated in FIG. 8A, the system 820 in FIG. 8B measures a current $i_4$ 826 through the secondary winding of the step-down transformer 827 using current transformer 826. Current $i_4$ 826 may be related to current $i_{c4}$ 824 through capacitance 734. In this configuration, Eq. 17 can be used with Eq. 13, Eq. 5, Eq. 6, and Eq. 7 to determine a voltage signal for use in connection with the systems and methods disclosed herein.

Figure 8C:
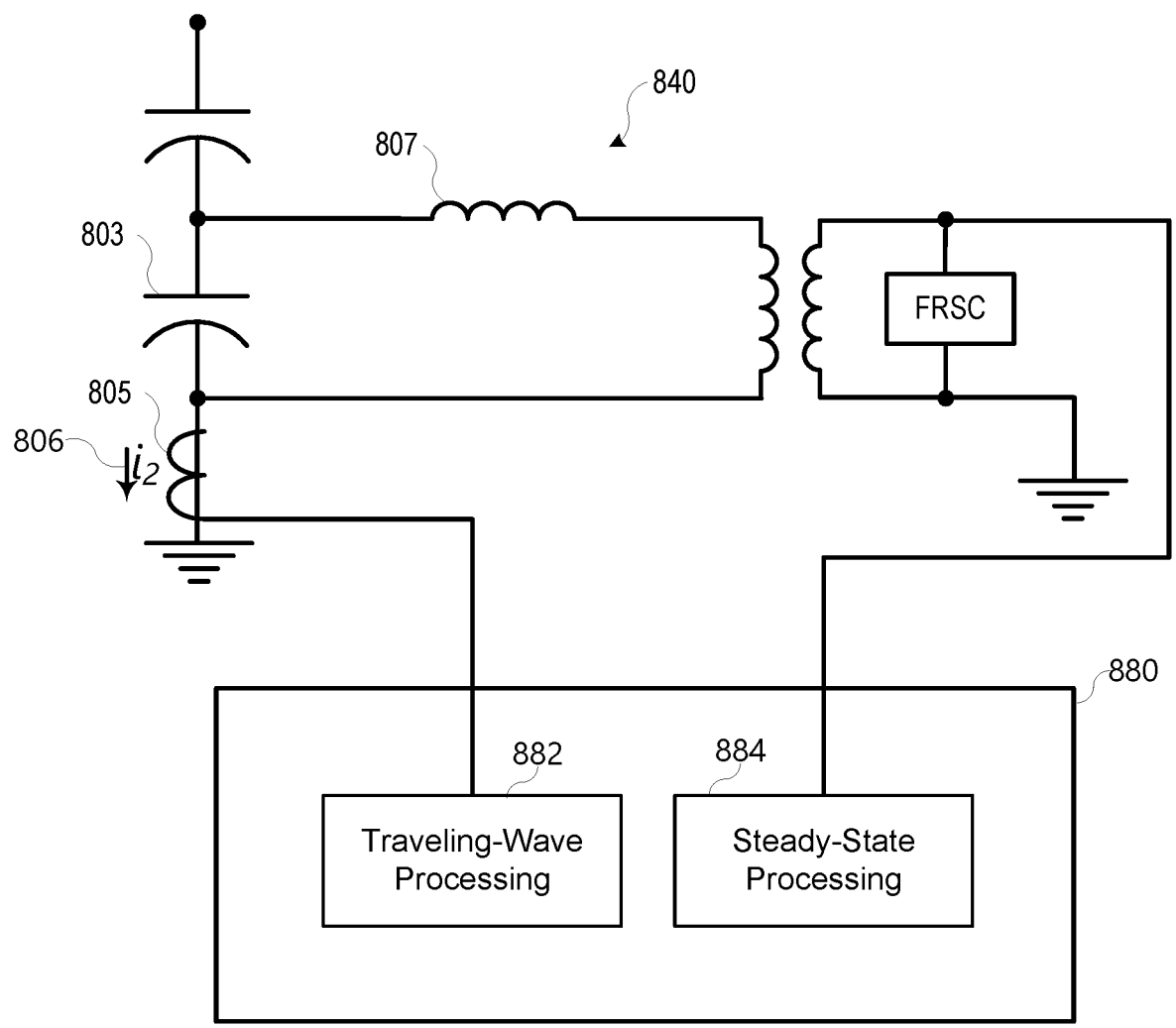
FIG. 8C illustrates a simplified diagram of a system to determine a voltage signal based on a current measurement in a CCVT consistent with embodiments of the present disclosure.

FIG. 8C illustrates a diagram of a system 840 to provide power system protection functionality based on a current and/or voltage measurement in a CCVT and to obtain measurements useful to monitor CCVT health consistent with embodiments of the present disclosure. In contrast to the system 820 illustrated in FIG. 8B, the system 840 in FIG. 8C does not calculate a high-fidelity voltage based on the current and voltage measurement in the CCVT. In contrast to various embodiments consistent with the present disclosure, where high-fidelity voltage measurements may be subsequently filtered using a differentiator-smoother technique or other techniques appropriate for extracting traveling waves and steady-state voltages, the system 840 in FIG. 8C uses a current $i_2$ 806 measurement directly using current transformer 805 for extracting traveling waves and uses the CCVT secondary voltage directly for steady-state voltages. Traveling waves may be extracted using a traveling-wave processing module 882 of an IED 880. In some embodiments, high-frequency current primarily conducts through the capacitor stack and is measured by the current transformer 805. In this way, the current $i_2$ 806 from transformer 805 may be used by a traveling-wave processing module 882. Similarly, the CCVT secondary voltage may be used separately for steady-state power system protection functions in the steady-state processing module 884. Thus, it is contemplated that the merits of the present disclosure may be combined in various ways to perform the functions of power system protection and metering without needing to calculate a high-fidelity voltage.

Figure 9:
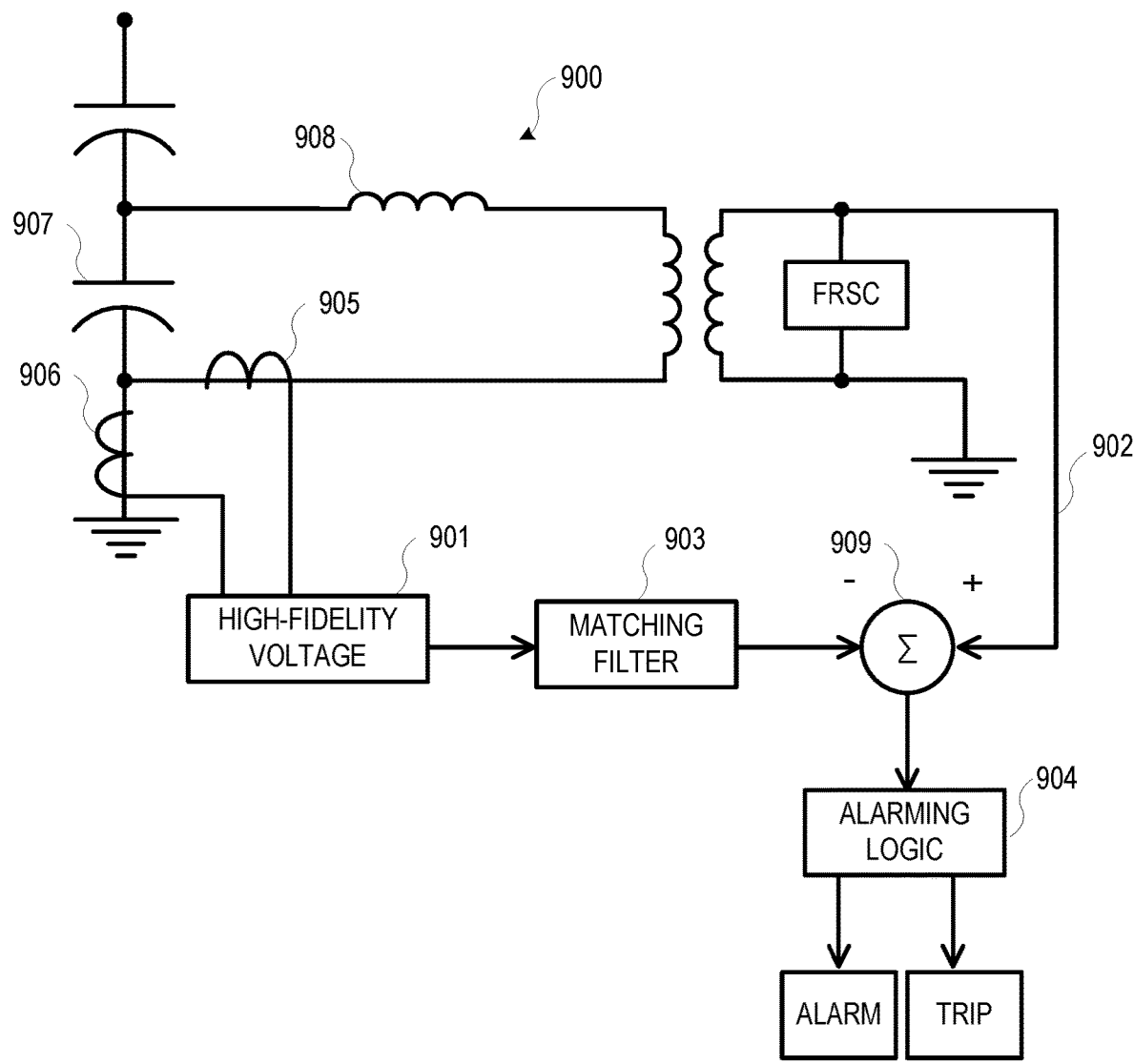
FIG. 9 illustrates a functional block diagram of a system to utilize a high-fidelity voltage signal in a system for issuing an alarm and/or a control action consistent with embodiments of the present disclosure.

FIG. 9 illustrates a functional block diagram of a system 900 to utilize a high-fidelity voltage signal in a system for issuing an alarm and/or a control action consistent with embodiments of the present disclosure. Current transformers 905 and 906 may be used to generate a high-fidelity voltage signal 901 as described in several embodiments above.

System 900 compares the high-fidelity voltage 901 with the secondary voltage output of the CCVT 902. The comparison may be filtered to match the frequency response of a normally-functioning CCVT using a matching filter 903. Differences between the two signals may indicate a problem within the CCVT or with the measurements and may trigger an alarm and/or a control action, such as issuing a trip command to the appropriate breaker or breakers to de-energize the CCVT. For example, if capacitor 907 changes its value by 1%, the CCVT secondary voltage 902 will also change by approximately 1%. In addition, the change in the capacitance may also cause a phase shift between the primary and secondary voltage. The phase shift may result from a mismatch with the tuning reactor 908 due to the capacitance changes associated with a potential failure of the CCVT. Various embodiments may utilize nominal values of capacitor 907. Actual changes in capacitance values may change the output in an amount proportional to the change in the $i_{c2}$ current, which is likely to differ from the actual change in the capacitance value. As a result of this difference, signals received by summer 909 will not match, thus allowing system 900 to detect possible failures.

The alarming logic 904 may operate based on several different principles. For example, it may measure the fundamental frequency component of output of summer 909 and compare its magnitude with a threshold. In some embodiments, alarming logic 904 may apply a time delay before issuing the alarm. In still other embodiments, alarming logic 904 may use a lower threshold to alarm and a higher threshold to issue a trip command. In still other embodiments, alarming logic 904 may integrate the difference and respond with the alarm if the integral is small and with a trip command if the integral is large.

Figure 10:
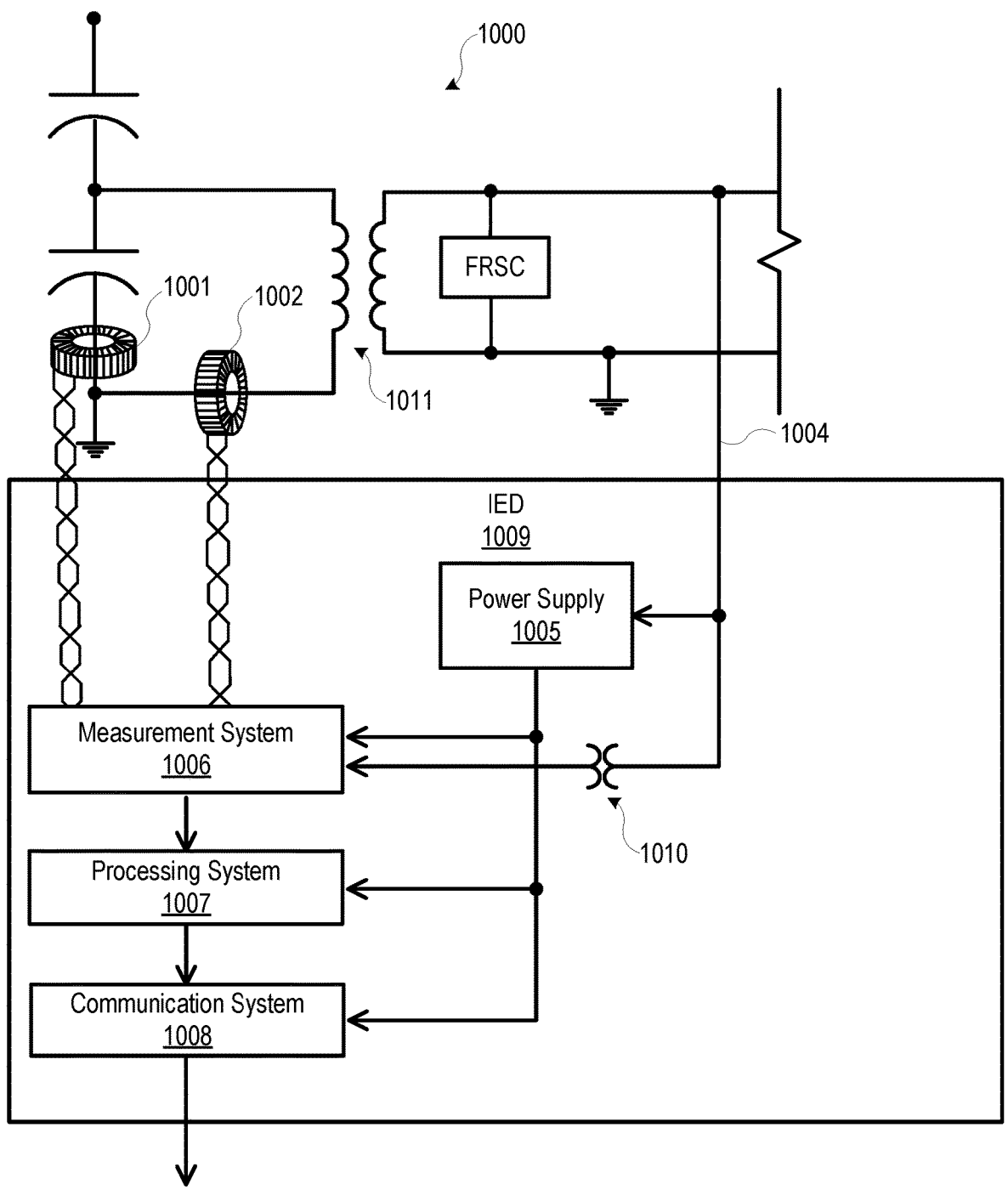
FIG. 10 illustrates a block diagram of a system to monitor a CCVT consistent with embodiments of the present disclosure.

FIG. 10 illustrates a block diagram of a system 1000 to monitor a CCVT consistent with the present disclosure. Two current transformers 1001 and 1002 are in electrical communication with the CCVT and the CCVT secondary voltage 1004. Current transformers typically do not generate large signals, and accordingly, the length of their leads connecting to the device implementing the present invention may be limited. As a result, the IED 1009 may be installed in a proximity to the CCVT. In one embodiment, the IED 1009 may be installed in the substation switchyard.

In the illustrated embodiment, power for an IED 1009 is drawn from the secondary voltage output of the CCVT 1004. In alternative embodiments, power may be provided by other sources. As illustrated, a power supply 1005 may provide power to other components in system 1000. Power supply 1005 may be designed to accept CCVT output voltage without introducing any consequential distortions to this voltage, and therefore not impacting accuracy of other end devices in system 1000 or other devices connected to the same voltage 1004. The connection from the secondary CCVT output to the device may be fused, but the fuse is not shown in the interest of simplicity. A typical CCVT is rated for a burden of upwards of 100 W. The actual burden created by IED 1009 may be much lower and therefore a CCVT can provide several Watts of power to power the device in system 1000. In some embodiments, secondary voltage from all three power system phases may be used to power the device, thus distributing the load.

In the illustrated embodiment a potential transformer 1010 provides a measurement of the voltage associated with the secondary output from a step-down transformer 1011. Using the voltage measurement of the secondary output from the step-down transformer 1011 during a steady state period, system 1000 may determine the values of N, $C_1$ and $C_2$, which may be used in connection with various equations, including Eq. 3, Eq. 4. And Eq. 7.

The secondary voltage 1004 is provided to the measurement system in addition to signals from current transformers 1001 and 1002. In some embodiments, an alarm subsystem may be included within the measurement system 1006. Measurement system 1006 may include an ADC to create digitized representations of the signals from current transformers 1001 and 1002.

The measurements are provided to a processing system 1007. Processing system 1007 may analyze the measurements and generate alarms and or control actions. The processing system 1007 may transmit the high-fidelity voltage, the secondary voltage, the alarm signal, and the trip signal using a communication system 1008. Communication system 1008 may communicate using a variety of communication media and protocols. In some embodiments, communication system 1008 provide a representation of the high-fidelity full-scale voltage signal as an output. Still further, communication system 1008 may provide a representation of the voltage derivative directly as a representation of a voltage traveling waves. In some embodiments, communication system 1008 may communicate via a fiber optic medium. Other forms of communication media may also be used.

Systems and methods consistent with the present disclosure may generate high-fidelity voltage signals in the frequency spectrum of up to several hundreds of kHz. Therefore, the sampling rate for digitizing the signals of interest and providing them to the devices consuming the information, may be in the range of 1 MHz or higher.

Figure 11:
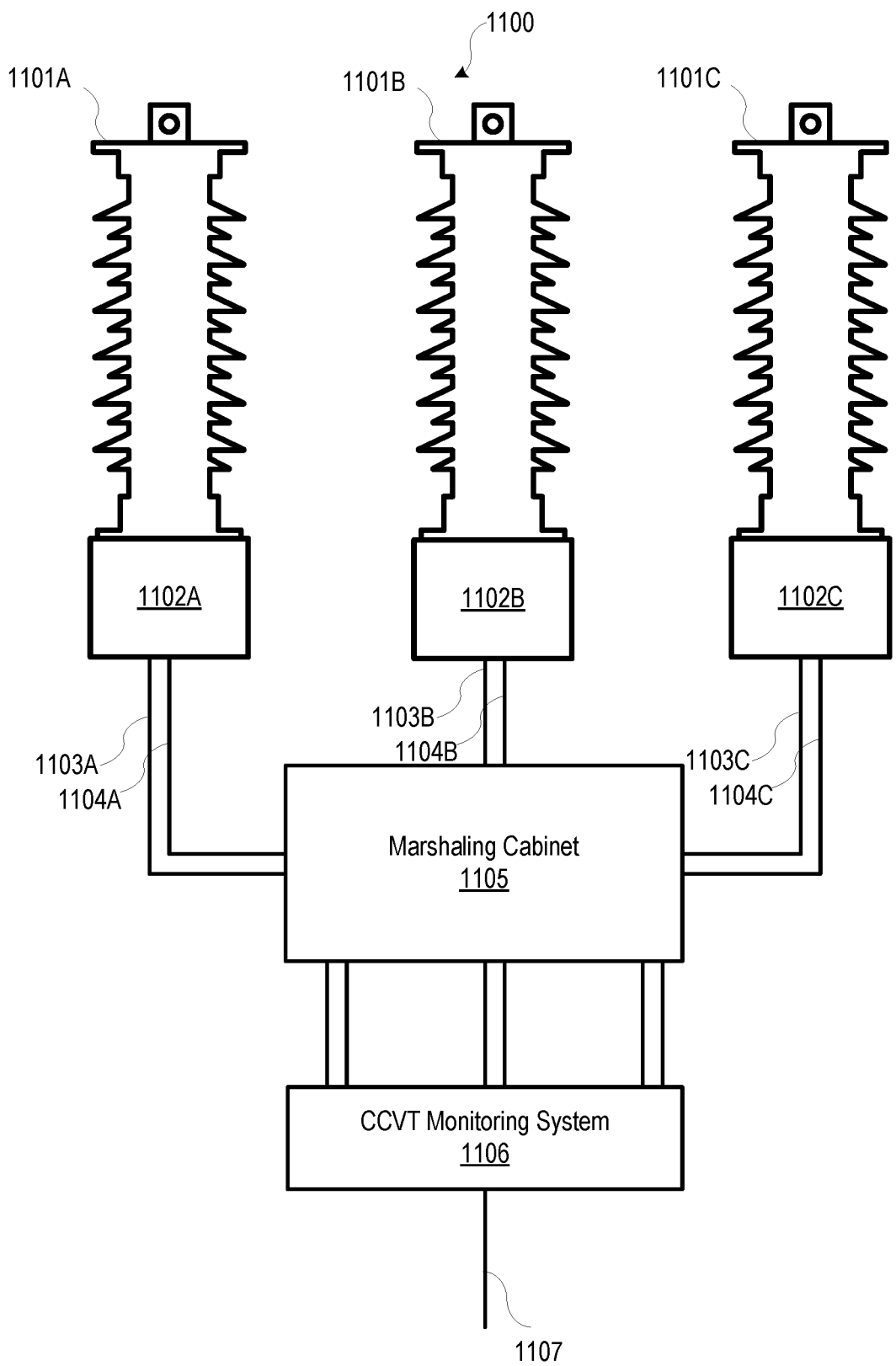
FIG. 11 illustrates a simplified diagram of a three-phase CCVT system consistent with embodiments consistent with the present disclosure.

FIG. 11 illustrates a representation of the placement of a system consistent with respect to a CCVT consistent with embodiments of the present disclosure. A CCVT monitoring system 1106 consistent with the present disclosure may be disposed in a substation switchyard in proximity to the marshaling cabinet 1105. The signals of interest may be provided to other devices, via a communication channel 1107. In some embodiments, the other devices may be located in the control house. The communication channel 1107 may be embodied as a fiber optic connection or other type of communication media.

The marshaling cabinet 1105 is typically a part of a practical CCVT installation. It allows a cross-connection and demarcation point between the voltage control cables that run toward the control house and the single-phase CCVTs 1101A, 1101B, and 1101C in the switchyard. These CCVTs serve the A, B, and C phases of the three-phase power system, and may have their own cabinets 1102A, 11026, and 1102C at the bottom. A CCVT monitoring system consistent with the present disclosure may place the current transformers inside the 1102A, 11026, and 1102C cabinets and may be connected via shielded twisted-pair cables 1103A, 11036, and 1103C to the marshaling cabinet 1105, using a similar path and conduits—if possible—as the secondary voltage cables. The secondary voltages may be connected to the marshaling cabinet 1105 with the single-phase voltage cables 1104A, 11046, and 1104C. The CCVT monitoring system 1106 may be placed inside the marshaling cabinet 1105 if space permits, or in its own cabinet mounted in proximity to the marshaling cabinet 1105.

Figure 12:
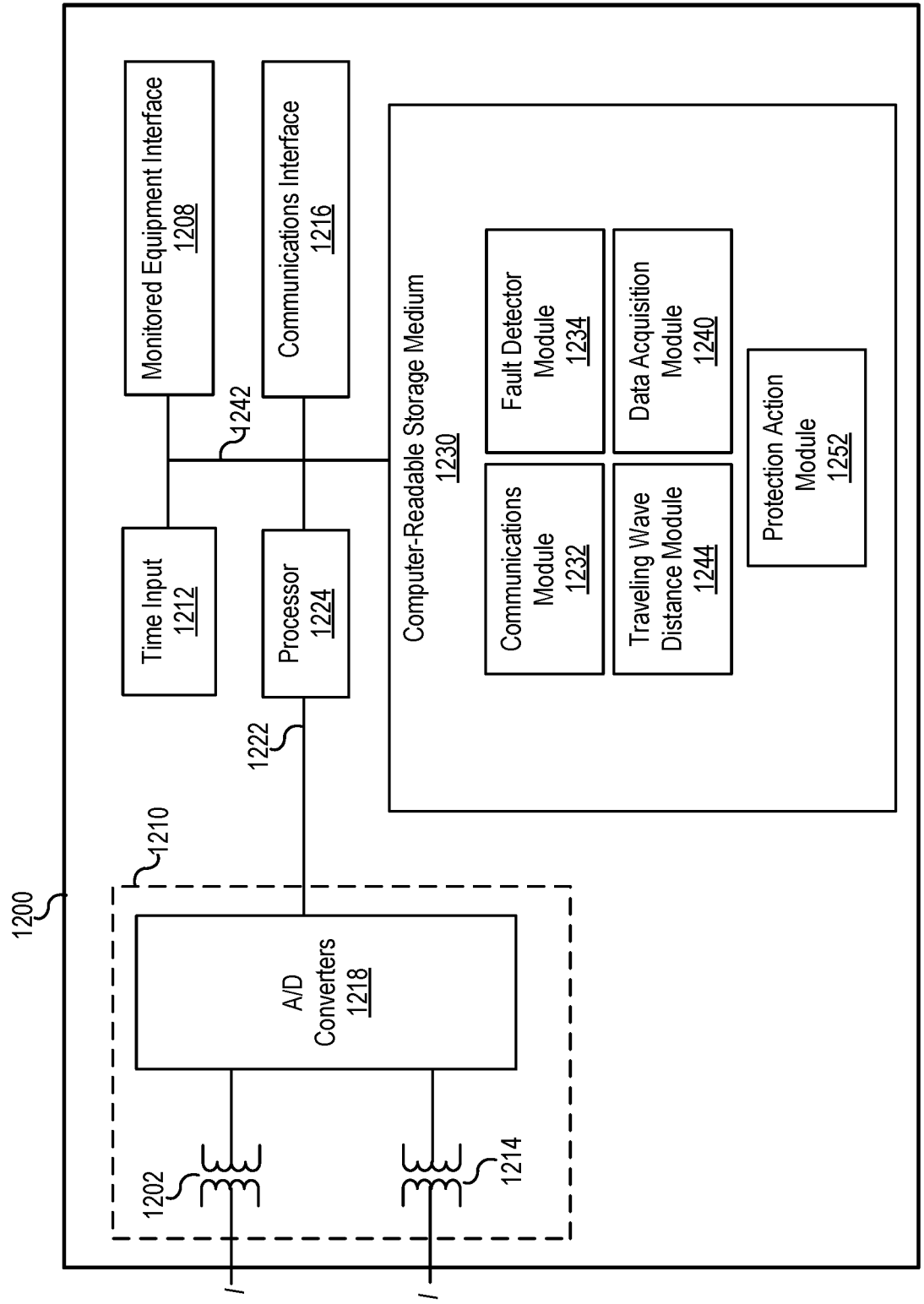
FIG. 12 illustrates a functional block diagram of a system for detecting and locating faults using traveling waves consistent with embodiments of the present disclosure.

FIG. 12 illustrates a functional block diagram of a system 1200 for detecting and locating faults using traveling waves consistent with embodiments of the present disclosure. System 1200 includes a communications interface 1216 to communicate with devices and/or IEDs. In certain embodiments, the communications interface 1216 may facilitate direct communication with other IEDs or communicate with systems over a communications network. Consistent with the embodiments of this disclosure the interface 1216 may include communications with the CCVT high-fidelity voltage IED with the intent to receive the high-fidelity voltage, the secondary CCVT voltage, voltage TWs, CCVT alarm and trip signals, or a combination of the above. Also, the interface 1216 may provide the said CCVT information to other devices. Communications interface 1216 may facilitate communications through a network. System 1200 may further include a time input 1212, which may be used to receive a time signal (e.g., a common time reference) allowing system 1200 to apply a time-stamp to the acquired samples. In certain embodiments, a common time reference may be received via communications interface 1216, and accordingly, a separate time input may not be required for time-stamping and/or synchronization operations. One such embodiment may employ the IEEE 1588 protocol. A monitored equipment interface 1208 may receive status information from, and issue control instructions to, a piece of monitored equipment, such as a circuit breaker, conductor, transformer, or the like.

Processor 1224 may process communications received via communications interface 1216, time input 1212, and/or monitored equipment interface 1208. Processor 1224 may operate using any number of processing rates and architectures. Processor 1224 may perform various algorithms and calculations described herein. Processor 1224 may be embodied as a general-purpose integrated circuit, an application-specific integrated circuit, a field-programmable gate array, and/or any other suitable programmable logic device.

In certain embodiments, system 1200 may include a sensor component 1210. In the illustrated embodiment, sensor component 1210 gathers data directly from conventional electric power system equipment such as a conductor (not shown) using potential transformers and/or current transformers. In various embodiments, sensor component 1210 may be in electrical communication with a clamp-on CT in a CCVT as described in connection with various embodiments of the present disclosure. The sensor component 1210 may use, for example, transformers 1202 and 1214 and A/D converters 1218 that may sample and/or digitize filtered waveforms to form corresponding digitized current and voltage signals provided to data bus 1222. A/D converters 1218 may include a single A/D converter or separate A/D converters for each incoming signal. A current signal may include separate current signals from each phase of a three-phase electric power system. A single line diagram is shown only for the sake of clarity.

A/D converters 1218 may be connected to processor 1224 by way of data bus 1222, through which digitized representations of current and voltage signals may be transmitted to processor 1224. In various embodiments, the digitized current and voltage signals may be used to calculate time-domain quantities for the detection and the location of a fault on an electric power system as described herein.

A computer-readable storage medium 1230 may be the repository of various software modules to perform any of the methods described herein. A data bus 1242 may link monitored equipment interface 1208, time input 1212, communications interface 1216, and computer-readable storage medium 1230 to processor 1224.

Communications module 1232 may allow system 1200 to communicate with any of a variety of external devices via communications interface 1216. Communications module 1232 may be configured for communication using a variety of data communication protocols (e.g., UDP over Ethernet, IEC 61850, etc.).

Data acquisition module 1240 may collect data samples such as the current and voltage quantities and the incremental quantities. The data samples may be associated with a timestamp and made available for retrieval and/or transmission to a remote IED via communications interface 1216. Traveling waves may be measured and recorded in real-time, since they are transient signals that dissipate rapidly in an electric power delivery system. Data acquisition module 1240 may operate in conjunction with fault detector module 1234. Data acquisition module 1240 may control recording of data used by the fault detector module 1234. According to one embodiment, data acquisition module 1240 may selectively store and retrieve data and may make the data available for further processing. Such processing may include processing by fault detector module 1234, which may determine the occurrence of a fault with an electric power distribution system.

Traveling wave distance module 1244 may detect a fault on the electric power delivery system within a zone of protection. In various embodiments, the systems and methods disclosed in each of the following applications may be used to determine whether a fault occurs within a zone of protection:

Application Ser. No. 16/137,343, filed on Sep. 20, 2018, and are titled DISTANCE PROTECTION USING TRAVELING WAVES IN AN ELECTRIC POWER DELIVERY SYSTEM;

application Ser. No. 16/137,350, filed on Sep. 20, 2018, and are titled SECURE TRAVELING WAVE DISTANCE PROTECTION IN AN ELECTRIC POWER DELIVERY SYSTEM; and application Ser. No. 16/137,330, filed on Sep. 20, 2018, and are titled TRAVELING WAVE IDENTIFICATION USING DISTORTIONS FOR ELECTRIC POWER SYSTEM PROTECTION.

Each application is incorporated herein by reference.

The traveling wave distance module 1244 may use the high-fidelity voltage signals obtained using the systems and methods described herein to determine occurrence of a traveling wave, and time stamp occurrences of a traveling wave. The time stamps may be used to determine a time of occurrence of the fault and a time of the arrival of the traveling wave from the fault to the CCVT. The traveling wave distance module 1244 may compare the time difference between the time of the fault and the time of arrival of the traveling wave against a predetermined reach setting in order to instigate a traveling wave distance signal TW21. The traveling wave distance signal TW21 may be used by other modules, such as the protection action module 1252, fault detector module 1234, and the like. In some embodiments, traveling wave distance module 1244 may analyze the dispersion associated with ground and aerial modes of a traveling wave to estimate a distance to fault.

A protective action module 1252 may implement a protective action based on the declaration of a fault by the fault detector module 1234. In various embodiments, a protective action may include tripping a breaker, selectively isolating a portion of the electric power system, etc. In various embodiments, the protective action module 1252 may coordinate protective actions with other devices in communication with system 1200. In various embodiments, system 1200 may provide protection based on instantaneous voltages and currents. Such signal components require shorter data windows but facilitate faster protection. Various embodiments of system 1200 may achieve an operating time of approximately 1 millisecond.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect a fault in an electric power delivery system, comprising:
    a capacitance-coupled voltage transformer (CCVT) in electrical communication with the electric power delivery system, the CCVT comprising a stack of capacitors and an electrical contact to a first ground connection;
    a first current measurement device disposed between the stack of capacitors and the first ground connection, the first current measurement device to provide a first electrical signal corresponding to a first current flowing through the CCVT;

a second current measurement device disposed in electrical connection with a parasitic current of the CCVT, the second current measurement device to provide a second electrical signal corresponding to the parasitic current;
an intelligent electronic device (IED) in electrical communication with the first and second current measurement devices to:
generate a first voltage signal based on the first electrical signal from the first current measurement device and the second electrical signal from the second current measurement device;
identify an incident traveling wave and a reflected traveling wave based on the first voltage signal and the measurement of the primary current;
detect a fault based on the incident traveling wave and the reflected traveling wave; and
a protective action module to implement a protective action based on detection of the fault.

2. The system of claim 1, further comprising:
a step-down transformer comprising a primary winding electrically connected to a transformer secondary; and
the second current measurement device is disposed in electrical connection with the secondary of the step-down transformer.

3. The system of claim 2, further comprising:
a tuning reactor in electrical communication with the step-down transformer, wherein the IED further:
generates a second voltage signal based on the electrical signal from the second current measurement device; and
identifies the incident traveling wave and the reflected traveling wave based on the first voltage signal and the second voltage signal.

4. The system of claim 2, wherein the second current measurement device is disposed between the secondary of the step-down transformer and ground.

5. The system of claim 1, wherein the second current measurement device is disposed in a terminal housing of the CCVT.

6. The system of claim 5, wherein the second current measurement device is disposed in an accessible portion of the terminal housing.

7. The system of claim 6, wherein the terminal housing comprises the accessible portion and a non-accessible portion.

8. The system of claim 1, wherein the parasitic electric flow comprises a parasitic capacitance.

9. A system to detect a fault in an electric power delivery system, comprising:
a capacitance-coupled voltage transformer (CCVT) in electrical communication with the electric power delivery system, the CCVT comprising a stack of capacitors and an electrical contact to a first ground connection;
a first current measurement device disposed between the stack of capacitors and the first ground connection, the first current measurement device to provide a first electrical signal corresponding to a first current flowing through the CCVT;
a step-down transformer comprising a primary winding electrically connected to a transformer secondary; and
an intelligent electronic device (IED) in electrical communication with the first current measurement device and the secondary of the step-down transformer to:
generate a first voltage signal based on the first electrical signal from the first current measurement device;
calculate a second voltage from a transfer function of the step-down transformer and a signal from the secondary of the step-down transformer;
identify an incident traveling wave and a reflected traveling wave based on the first voltage signal and the second voltage;
detect a fault based on the incident traveling wave and the reflected traveling wave; and,
a protective action module to implement a protective action based on detection of the fault.

10. The system of claim 9, wherein the signal from the secondary of the step-down transformer comprises a secondary voltage signal.

11. The system of claim 9, further comprising a ferroresonance suppression circuit across the transformer secondary of the step-down transformer.

12. The system of claim 9, further comprising a tuning reactor of the step-down transformer.

13. The system of claim 9, further comprising a second current measurement device disposed between the step-down transformer secondary and ground, the second current measurement device to provide a second electrical signal.

14. The system of claim 13, wherein the IED is further configured to generate the first voltage signal based on the second current measurement.

15. The system of claim 13 wherein the second current measurement device is disposed in an accessible portion of a terminal housing.

16. A system to detect a fault in an electric power delivery system, comprising:
a capacitance-coupled voltage transformer (CCVT) in electrical communication with the electric power delivery system, the CCVT comprising a stack of capacitors and an electrical contact to a first ground connection;
a first current measurement device disposed between the stack of capacitors and the first ground connection, the first current measurement device to provide a first electrical signal corresponding to a first current flowing through the CCVT;
a step-down transformer comprising a primary winding electrically connected to a transformer secondary; and
an intelligent electronic device (IED) in electrical communication with the first current measurement device and the secondary of the step-down transformer to:
generate a first voltage signal based on the first electrical signal from the first current measurement device;
generate a second voltage signal from the transformer secondary of the step-down transformer;
identify an incident traveling wave and a reflected traveling wave based on the first electrical signal corresponding to a first current flowing through the CCVT;
detect a fault based on the incident traveling wave and the reflected traveling wave;
determine a steady-state electric power system condition from second voltage signal from the transformer secondary of the step-down transformer; and,
a protective action module to implement a protective action based on detection of the fault and the steady-state electric power system condition.

17. A system to detect a fault in an electric power delivery system, comprising:
a capacitance-coupled voltage transformer (CCVT) in electrical communication with the electric power delivery system, the CCVT comprising a stack of capacitors and an electrical contact to a first ground connection;

a first current measurement device disposed between the stack of capacitors and the first ground connection, the first current measurement device to provide a first electrical signal corresponding to a first current flowing through the CCVT;

a step-down transformer comprising a primary winding electrically connected to a transformer secondary;

a second current measurement device in electrical connection with the secondary of the step-down transformer the second current measurement device to provide a second electrical signal corresponding to a the parasitic current;

a tuning reactor in electrical communication with the step-down transformer; and an intelligent electronic device (IED) in electrical communication with the first and second current measurement devices to:

generate a first voltage signal based on the first electrical signal from the first current measurement device;

generate a second voltage signal based on the second electrical signal from the second current measurement device;

identify an incident traveling wave and a reflected traveling wave based on the first voltage signal, the second voltage signal, and the measurement of the primary current;

detect a fault based on the incident traveling wave and the reflected traveling wave; and a protective action module to implement a protective action based on detection of the fault.

* * * * *